United States Patent [19]
Sato

[11] Patent Number: 6,143,629
[45] Date of Patent: Nov. 7, 2000

[54] PROCESS FOR PRODUCING SEMICONDUCTOR SUBSTRATE

[75] Inventor: Nobuhiko Sato, Sagamihara, Japan

[73] Assignee: Canon Kabushiki Kaisha, Tokyo, Japan

[21] Appl. No.: 09/389,361

[22] Filed: Sep. 3, 1999

[30] Foreign Application Priority Data

Sep. 4, 1998 [JP] Japan .................................. 10-251272

[51] Int. Cl.$^7$ .................................................. H01L 21/30
[52] U.S. Cl. .......................... 438/455; 438/455; 438/456; 438/457; 438/458; 438/459; 438/460; 438/149; 438/150; 438/151; 438/152; 438/153; 438/154; 438/155; 257/758
[58] Field of Search ..................................... 438/149, 150, 438/151, 152, 153, 154, 155, 455, 456, 457, 458, 459, 460; 257/758

[56] References Cited

U.S. PATENT DOCUMENTS

| | | | |
|---|---|---|---|
| 4,933,255 | 6/1990 | Hata et al. | 430/131 |
| 5,371,037 | 12/1994 | Yonehara | 437/86 |
| 5,492,859 | 2/1996 | Sakaguchi et al. | 437/86 |
| 5,536,361 | 7/1996 | Kondo et al. | 156/630.1 |
| 5,670,411 | 9/1997 | Yonehara et al. | 437/62 |
| 5,869,387 | 2/1999 | Sato et al. | 438/459 |
| 5,980,633 | 11/1999 | Yamagata et al. | 117/94 |
| 6,008,540 | 12/1999 | Lu et al. | 257/758 |

FOREIGN PATENT DOCUMENTS

| | | |
|---|---|---|
| 0 755 068 | 1/1997 | European Pat. Off. . |
| 5-21338 | 1/1993 | Japan . |
| 9-100197 | 4/1997 | Japan . |

OTHER PUBLICATIONS

S. Tong Lee, et al., "Enhanced Oxygen Diffusion in Silicon at Thermal Donor Formation Temperatures", Appl. Phys. Lett., vol. 49, no. 26, pp. 1793–1795 (1986).
N. Sato, et al., "Hydrogen Annealed Silicon–on–Insulator", Appl. Phys. Lett., vol. 65, no. 15, pp. 1924–1926 (1994).
H. Takai, et al., "Isolation of Silicon Film Grown on Porous Silicon Laryer", J. Elect. Mat., vol. 12, no. 6, pp. 973–982 (1983).
L. Vescan, et al., "Low–Pressure Vapor–Phase Epitaxy of Silicon on Porous Silicon", Materials Letter, vol. 7, no. 3, pp. 94–98 (1988).
H. Takai, et al., "Porous Silicon Layers and Its Oxide for the Silicon–on Insulator Structure", J. Appl. Phys., vol. 60, no. 1, pp. 222–225 (1986).
T. Unagami, et al., "Structure of Porous Silicon Layer and Heat–Treatment Effect", J. Electrochem. Soc., volo. 125, no. 8, pp. 1339–1344 (1978).
T. Yonehara, et al., "Epitaxial Layer Transfer by Bond and Etch Back of Porous Si", Appl. Phys. Lett., vol. 64, no. 16, pp. 2108–2110 (1994).
K. Imai, "A new Dielectric Isolation Method Using Porous Silicon", Solid State Elec., vol. 24, no. 2, pp. 159–164 (1981).
A. Uhlir, Jr., "Electrolytic Shaping of Germanium and Silicon", Bell System Tech. J., vol. 35, pp. 333–347 (1956).
K. Izumi, et al., "C.M.O.S., Devices Fabricated on Buried SiOlayers formed by oxygen implantation into Silicon", Elec. Lett., vol. 14, no. 18, pp. 593–594 (1978).
J. B. Lasky, et al., "Silicon–on Insulator (SOI) by Bonding and Etch–Back", IntO'l. Elec. Devices Meeting, Washington DC, pp. 684–687 (1985).

*Primary Examiner*—John F. Niebling
*Assistant Examiner*—Viktor Simkovic
*Attorney, Agent, or Firm*—Fitzpatrick, Cella, Harper & Scinto

[57] ABSTRACT

In a process for producing a semiconductor substrate, comprising sealing surface pores of a porous silicon layer and thereafter forming a single-crystal layer on the porous silicon layer by epitaxial growth, intermediate heat treatment is carried out after the sealing and before the epitaxial growth and at a temperature higher than the temperature at the time of the sealing. This process improves crystal quality of the semiconductor substrate having the single-crystal layer formed by epitaxial growth and improves smoothness at the bonding interface when applied to bonded wafers this process enables the detection of the smaller particles on the surface by a laser light scattering method.

32 Claims, 9 Drawing Sheets

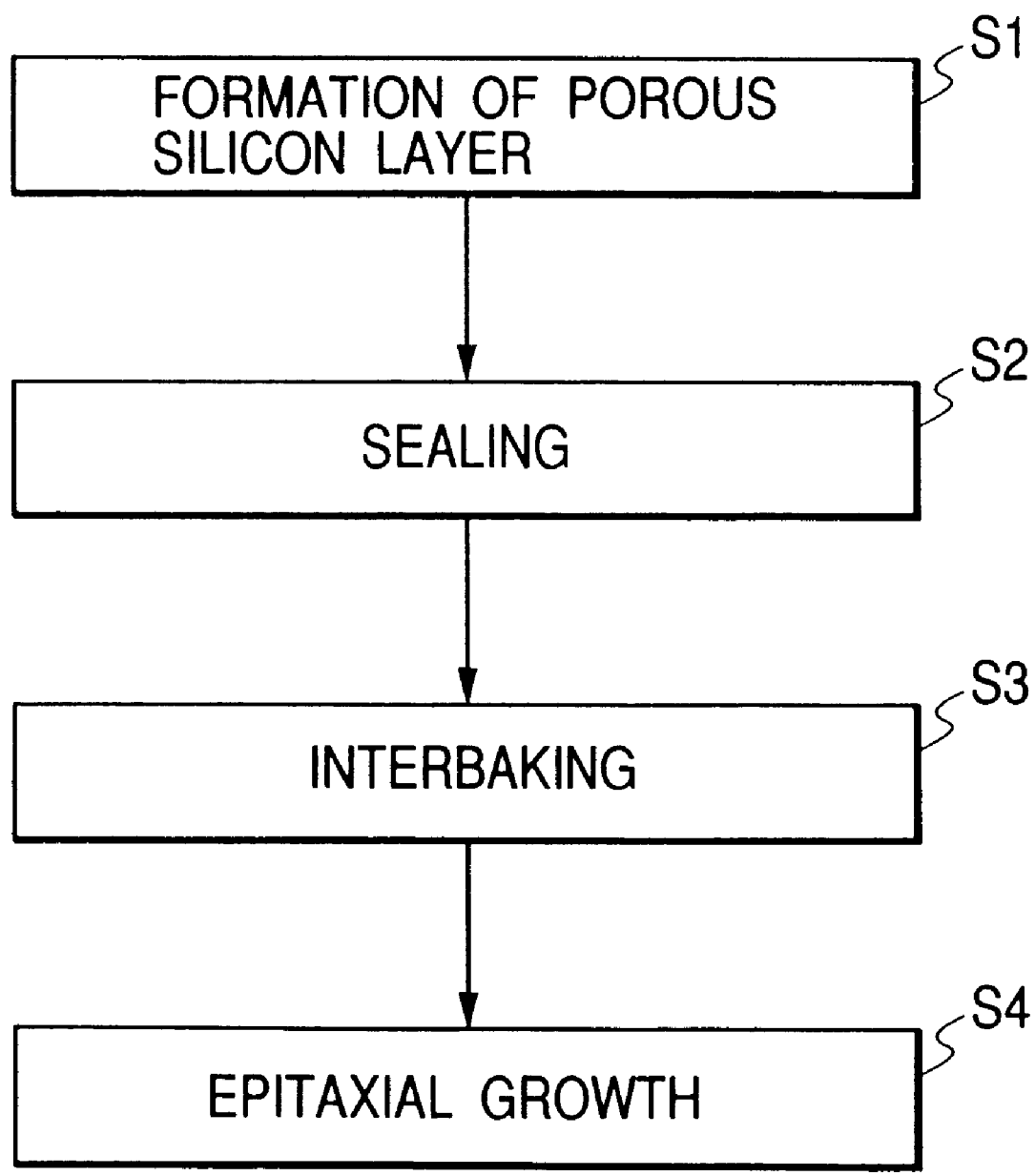

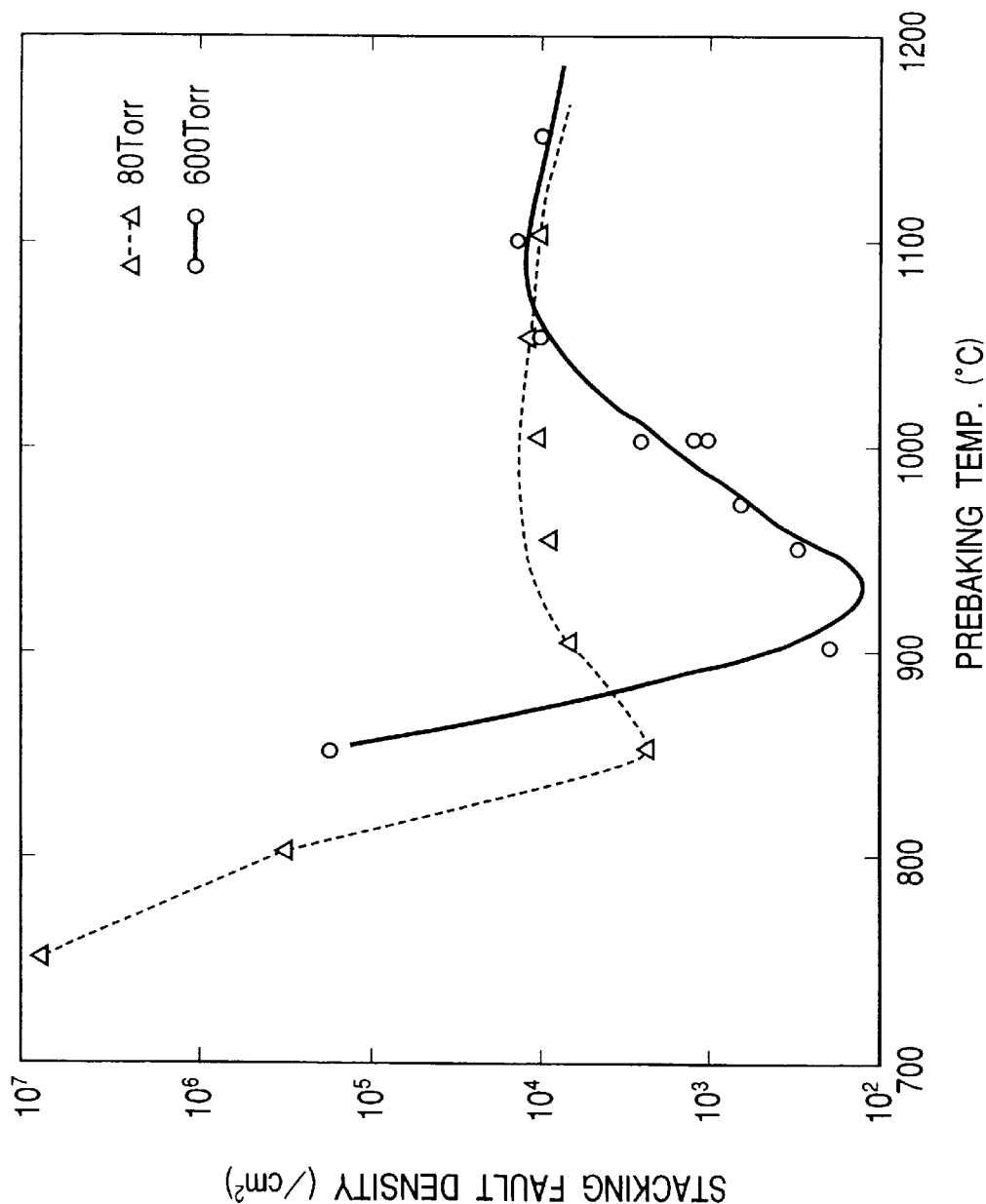

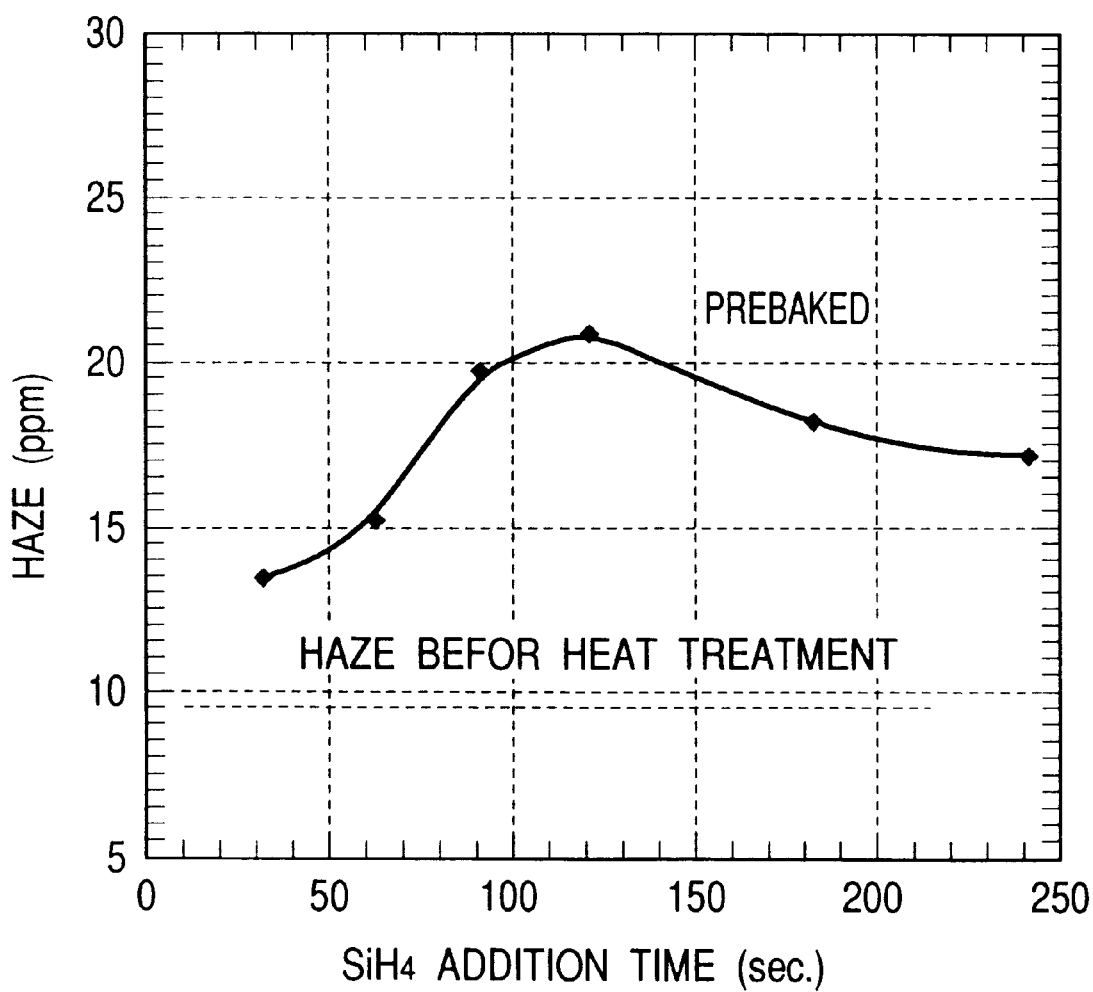

PROCESS FOR PRODUCING SEMICONDUCTOR SUBSTRATE

BACKGROUND OF THE INVENTION

1. Field of the Invention

This invention relates to semiconductor substrates used chiefly as base members of integrated circuits making use of MOSFETs or bipolar transistors, and a process for their production.

2. Related Background Art

With respect to of silicon type semiconductor devices and integrated circuits, silicon-on-insulator (SOI) structure has been studied at length as a technique which brings about high-speed operation, low power consumption, high integration and total-cost reduction of transistors by making their parasitic capacitance lower and facilitating device isolation.

In the 1970's, Imai proposed FIPOS (full isolation by porous silicon), a process in which the phenomenon of porous-silicon accelerated oxidation is utilized to form the SOI structure (K. Imai, Solid-state Electronics 24, 1981, p.159). In this process, an n-type island is formed on a p-type substrate. Thereafter, the p-type region, inclusive of the part underlying the n-type island, is selectively made porous by anodizing. Meanwhile, the n-type region remains non-porous.

Porous silicon was discovered in 1964 by Uhlir et al. (A. Uhlir, Bell Syst. Tech. J., 35, 1956, p.333), and has, like a sponge, pores of a few nanometers to tens of nanometers in diameter inside the silicon crystal and a surface areas per unit volume of as large as hundreds of $m^2/cm^3$ or more. Hence, upon thermal oxidation in an atmosphere containing oxygen, not only the surface of porous silicon but also its interior are simultaneously oxidized by the action of the oxygen having reached the interior of porous silicon, and hence porous layers can selectively be oxidized. The controlling of oxide film thickness relies on the thickness of a porous layer rather than the time of oxidation, and hence it is possible to form a silicon oxide film which is tens to hundreds of times as thick as that formed by oxidation of bulk silicon. That is, the porous region formed can completely be oxidized, and also the silicon island region can be maintained without oxidizing the n-type silicon island completely. This formation of a silicon island on porous silicon by this process is the FIPOS.

Silicon expands in volume upon oxidation. Hence, also in FIPOS, it has been considered preferable for the porous silicon to have a porosity of about 56% [porosity: pore volume/(residual silicon volume+pore volume)] in order to prevent volume expansion due to oxidation and also prevent wafer warpage and concomitant defect inclusion.

As an improvement of this process, a process has been proposed in which porous silicon is formed on the whole surface, thereafter non-porous single-crystal silicon is epitaxially grown on the porous silicon, thereafter part of the epitaxial silicon layer formed is removed to uncover the porous silicon and thereafter the porous silicon is selectively oxidized by thermal oxidation to accomplish the SOI structure (H. Takai and T. Itoh, Journal of Electric Materials 12, 1983, p.973).

As SOI-forming techniques which attract notice recently, an oxygen implantation process (SIMOX, separation by implanted oxygen) and a wafer bonding technology are available.

SIMOX is a process proposed by Izumi et al. in 1978 (K. Izumi, M. Doken and H. Ariyoshi, Electron Letters 14, 1978, p.593) and is a process in which oxygen is implanted in a silicon substrate, followed by heating at a temperature higher than 1,300° C. to form a buried silicon oxide layer. The buried silicon oxide layer has many restrictions because it relies on controlling the defect (or fault) density and oxide film quality.

Meanwhile, with regard to the use of a wafer bonding technique to accomplish the SOI structure, various methods have been proposed since the surface silicon layer and buried silicon oxide layer of the SOI structure can be made to have any desired layer thickness, and the surface silicon layer has a good crystallizability. A direct bonding process in which wafers are bonded to each other without interposing any intermediate layer such as an adhesive layer was proposed by Nakamura et al., but it is after J. B. Lasky et al.'s report in 1984 that this process has begun to be energetically studied; the report (J. B. Lasky, S. R. Stiffler, F. R. White and J. R. Abernathey, Technical Digest of the International Electron Devices Meeting, IEEE, New York, 1985, p.684) was made on a method of forming one of the bonded wafers into a thin film and how MOS transistors formed thereon operate.

As for the bonding technique, epock-making processes have been proposed, as disclosed in Japanese Patent Application Laid-Open No. 5-21338 and U.S. Pat. No. 5,371,037. An example of such a process is as described below: The surface of a single-crystal silicon wafer which is to serve as a first substrate is made porous by anodizing and thereafter a non-porous single-crystal silicon layer is epitaxially grown thereon to provide the first substrate. Thereafter, this is bonded to a second substrate, followed by heating to improve their bond strength, and then the first substrate is removed by grinding or polishing the back thereof to uncover the porous silicon layer over the whole surface. Thereafter, the porous silicon is selectively removed by etching, so that the non-porous single-crystal silicon layer is transferred onto the second substrate. It has become apparent that, as a result of the achievement of selectivity as high as 100,000 times, the uniformity of thickness of the resulting SOI layer is minimally damaged by etching and the uniformity at the time of the growth of the single-crystal silicon layer epitaxially grown is reflected as it is. More specifically, as an in-wafer uniformity achieved by a commercially available CVD epitaxial growth system, a uniformity of from 1.5% to 3% is achieved also in an SOI silicon layer.

In this process, the porous silicon having been used as a material for selective oxidation in FIPOS is used as a material for etching. Accordingly, those having a porosity of about 20% rather than about 56% are preferred. Also, since the porous silicon does not serve as a structural material of the final product, any structural change or coarsening of porous silicon is tolerable so long as the selectivity of etching is not damaged.

A process similar to the above process for producing the SOI structure as disclosed in Japanese Patent Application Laid-Open No. 5-21338 is disclosed also in Yonehara et al.'s report (T. Yonehara, K. Sakaguchi and N. Sato, Appl. Phys. Lett. 64, 1994, p.2108) and is called ELTRAN. In this process, the epitaxial growth of non-porous single-crystal silicon on porous silicon is one of the important techniques, and the stacking fault density in the epitaxial silicon layer on the porous silicon is $10^3/cm^2$ to $10^4/cm^2$, as so reported. In the SOI wafer thus obtained, such stacking faults are the main defects.

Sato et al. (N. Sato, K. Sakaguchi, K. Yamagata, Y. Fujiyama and T. Yonehara, Proc. of the Seventh Int. Symp.

on Silicon Mater. Sci. and Tech., Semiconductor Silicon, Pennington, The Electrochem. Soc. Inc., 1994, p.443) have carried out a CVD (chemical vapor deposition) process in which $SiH_2Cl_2$ is used as a material gas for the epitaxial growth on porous silicon. Process temperatures are 1,040° C. for prebaking and 900 to 950° C. for the growth; these temperatures which are higher than those in the report on the conventional FIPOS process. However, because of the introduction of preoxidation (400° C. for 1 hour in $O_2$) for oxidizing pore wall surfaces of porous silicon, structural coarsening of the porous silicon layer is substantially prevented. They report that the defects included in the epitaxial layer are predominantly occupied by the stacking faults and show that reducing the stacking faults contributes to reducing the number of pores of a porous silicon surface by four figures or more, e.g., bringing a density of $10^{11}/cm^2$ to a low density of $10^7/cm^2$ or less by hydrogen prebaking carried out before the growth in an epitaxial growth furnace. Lowering oxygen concentration in the vicinity of the porous layer surface by hydrofluoric-acid dipping (hereinafter often "HF-acid dipping") carried out immediately before the substrate is set in the epitaxial growth furnace is also effective for lessening the stacking faults. The stacking fault density in the epitaxial silicon layer on porous silicon is lowered to $10^3/cm^2$ or $10^4/cm^2$ by carrying out the HF-acid dipping for a long time, but the lowering of fault density was being saturated. Meanwhile, they suggest that the pores still remaining on the porous silicon surface also after the hydrogen prebaking are the origin of stacking faults. Growth rate is substantially above 100 nm/minute.

Sato et al. (N. Sato et al., Jpn. J. Appl. Phs. 35, 1996, p.973) also disclose that, in the epitaxial growth on porous silicon, the feeding of material silicon in a very small rate at the initial growth stage enables surface diffusion of silicon atoms adsorbed on the surface and makes it hard for crystal defects to be included even in residual pores, thereby lowering the crystal defect density. A similar technique is also disclosed in Japanese Patent Application Laid-Open No. 9-100197 and EP 755068.

Without limitation to the SOI structure, the non-porous single-crystal layers formed on porous silicon layers by conventional processes are sought to be improved in terms of smoothness of their surfaces and the porous silicon layers are also sought to be improved in terms of smoothness of the surface where the surface pores have been sealed up.

SUMMARY OF THE INVENTION

An object of the present invention is to provide a process for producing a semiconductor substrate having a non-porous single-crystal layer having fewer crystal defects, in particular, fewer stacking faults.

Another object of the present invention is to provide a process for producing a semiconductor substrate comprising a porous silicon layer provided thereon with a non-porous single-crystal layer having a superior surface smoothness.

Still another object of the present invention is to provide a process for producing a semiconductor substrate by which process the surface can effectively be smoothed.

A further object of the present invention is to provide a semiconductor substrate having fewer stacking faults.

The present invention provides a process for producing a semiconductor substrate having a non-porous single-crystal layer on a surface of a porous silicon layer, comprising the steps of:

sealing surface pores of the porous silicon layer to lower its surface pore density;

after the sealing step, subjecting the porous silicon layer whose surface pores have been sealed up, to heat treatment at a temperature higher than the temperature in the sealing step; and after the heating step, epitaxially growing the non-porous single-crystal layer on the surface of the porous silicon after the sealing step.

The present invention also provides a semiconductor substrate comprising an insulating material and a single-crystal silicon layer formed d thereon; the single-crystal silicon layer having a stacking fault density of 1,000 $cm^2$ or less and having a bonding interface where unevenness of 10 nm or more in depth is not observed.

BRIEF DESCRIPTION OF THE DRAWINGS

FIG. 1 illustrates a flow chart of a semiconductor substrate production process according to an embodiment of the present invention.

FIG. 7 shows the relationship between prebaking temperature, stacking fault density and pressure.

FIG. 9 shows the relationship between silicon gas addition time and haze in preinjection.

Figure 2A:
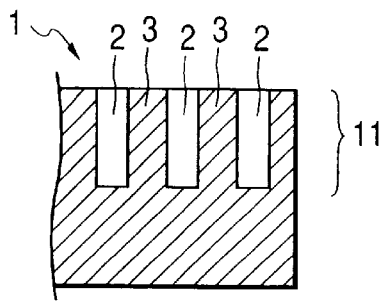
FIGS. 2A, 2B, 2C, 2D, 2E, and 2F illustrate a semiconductor substrate production process according to another embodiment of the present invention.

DESCRIPTION OF THE PREFERRED EMBODIMENTS (Embodiment 1)

FIG. 1 is a flow chart describing a semiconductor substrate production process according to a preferred embodiment of the present invention.

First, a base member having a porous silicon layer is prepared. The porous silicon layer is simply obtained, e.g., by anodizing at least one-side surface of a silicon substrate or the whole silicon substrate. (Step S1)

Next, the porous silicon layer is treated to seal surface pores present at its surface. The surface pores may be sealed by at least one of i) preheating (prebaking) in a reducing atmosphere not containing any silicon source gas and containing hydrogen and ii) treatment (preinjection) for imparting silicon atoms to the porous silicon layer by heat treatment while feeding silicon source gas in a very small quantity. Preferably, the prebaking may be followed by the preinjection. (Step S2)

The porous silicon layer whose surface pores have been sealed in this way is again subjected to heat treatment (intermediate heat treatment; hereinafter often "interbaking" for convenience) before the step of epitaxial growth described later. The interbaking is carried out at a temperature higher than the temperature at the time of sealing. In this step, the feeding of the silicon source gas is ceased so that the interbaking can be carried out in an atmosphere containing no silicon gas. (Step S3) It does not matter that the silicon source gas is inevitably included as a contaminant in the interbaking atmosphere.

Then, a non-porous single-crystal layer is formed on the surface of the porous silicon layer having been subjected to the interbaking and whose surface pores have been sealed. The material constituting this non-porous single-crystal layer may be either silicon formed by homoepitaxial growth or a material other than silicon formed by heteroepitaxial growth. (Step S4)

The foregoing is the basic production steps in the present embodiment. More preferred embodiments of the respective steps and embodiments of steps additionally employed will be described below in detail.

Formation of porous silicon layer:

As stated previously, the porous silicon layer was discovered in 1964 by Uhlir et al., and has, like a sponge, pores of a few nanometers to tens of nanometers in diameter inside the silicon crystal and a surface area per unit volume of as large as hundreds of $m^2/cm^3$ or more.

In the formation of porous silicon for light-emitting devices, $n^-$- or $p^-$-type substrates are preferred. When the SOI structure is produced, $n^+$- or $p^+$-type substrates are preferred to $n^-$- or $p^-$-type substrates because of their structural stability and a good crystallizability of epitaxial silicon layers. The porous silicon used in the present invention is substantially the same as these porous silicon materials conventionally studied and is produced by the process such as anodizing. There are no limitations on substrate impurities, plane directions and preparation methods so long as it is porous single-crystal silicon. When the porous silicon layer is formed by anodizing, its processing solution is an aqueous solution composed chiefly of hydrofluoric acid. During the anodizing, gases may adhere to electrodes and silicon surfaces, thereby rendering the porous layer non-uniform. Accordingly, an alcohol such as ethanol is commonly added to make the solution have a large contact angle so that the removal of gases having adhered can be accelerated and the anodizing can take place uniformly. Of course, the porous layer can be formed even without addition of the alcohol. In the case where the semiconductor substrate of the present invention is used in the FIPOS process, it is preferable to use porous silicon having a porosity of about 56%. In the case where it is used in the bonding process, it is preferable to use porous silicon having a low porosity (about 50% or less, and more preferably 30% or less). In either case, however, materials are not limited to these.

The porous silicon formed by anodizing as described above has a surface portion in which shallow pores are also present in addition to the pores extending to the inside of the porous silicon. It may be said that such shallow pores created "unevenness" which is shallow but uneven enough to be observed with a field emission type scanning electron microscope (FESEM) from the surface.

Pores appearing on the surface of the porous silicon are present in a pore density of, e.g., from $1 \times 10^{10}$ cm$^{-2}$ to $1 \times 10^{13}$ cm$^{-2}$.

Meanwhile, non-porous single-crystal silicon may be implanted with rare-gas ions of helium, neon or argon or hydrogen ions, optionally followed by heat treatment to form microbubbles in the non-porous single-crystal silicon at least in part, to make it porous.

The lower the porosity the porous silicon has, the lower the stacking fault density can be made in the layer formed on the porous silicon. Porous silicon having a low porosity can relatively readily be obtained by, e.g., at least one method selected from a method in which the anodizing is carried out at a high hydrofluoric-acid concentration, a method in which it is done at a low current density and a method in which it is done at a high temperature. Also, the whole substrate may be made porous, or only its surface portion may be made porous. Still also, as will be described later, the porous silicon may be so formed as to have at least two porous layers having porosities different from each other.

Sealing:

The sealing step used in the present invention is carried out by subjecting the porous silicon layer to heat treatment, the prebaking and/or preinjection mentioned previously, at a prescribed temperature in a prescribed atmosphere.

The temperature for the prebaking may arbitrarily be selected within the range of from 600° C. to 1,150° C. In the present embodiment, desirable results are obtained within a lower temperature region of preferably from 850° C. to 1,000° C., and most preferably from 900° C. to 950° C. The atmosphere for the prebaking may include a reducing atmosphere comprising 100% hydrogen and a reducing atmosphere containing hydrogen diluted with an inert gas such as argon. Alternatively, the prebaking may be carried out in ultra-high vacuum. When the desired effect is intended at a low cost, it may preferably be carried out in the atmosphere containing hydrogen. Suitable pressure is in the range of from $1 \times 10^{10}$ to 760 Torr.

The preinjection is carried out to lessen stacking faults more effectively, by feeding silicon atoms in a very small quantity to the porous layer surface at the initial stage of growth as disclosed in Japanese Patent Application Laid-Open No. 9-100197.

The temperature and pressure for the preinjection are in the same temperature and pressure ranges which may be selected for the prebaking described above. The silicon source gas may be fed in such a quantity that the silicon is deposited at a rate of 20 nm/minute or less, and more preferably 10 nm/minute or less, and most preferably 2 nm/minute or less. Such preinjection makes stacking faults occur less often in the single-crystal layer grown thereafter.

Thus, the surface pores present at the surface portion of the porous silicon layer are sealed up.

The silicon source gas with which the silicon atoms are imparted to the porous layer surface to stop up the pores in the porous layer may include $SiH_2Cl_2$, $SiH_4$, $SiHCl_3$, $SiCl_4$ and $Si_2H_6$. The silane $SiH_4$, which is gaseous at normal temperature and normal pressure, is more preferred in view of the controllability of feeding rate. When, in place of such CVD in a sense, the preinjection is carried out by MBE (molecular beam epitaxy), silicon atoms are fed from a solid source. In such an instance, the substrate temperature may be set at a low temperature of 800° C. or below and the growth rate may be set at 0.1 nm/minute or below.

The preinjection need not be carried out until all of the surface pores at the porous layer surface are sealed up and may be done to such an extent that the density of residual surface pores is $1 \times 10^8$ cm$^{-2}$ or less, and more preferably $1 \times 10^6$ cm$^{-2}$ or less.

Whether or not the time for preinjection has been ensured sufficiently can be confirmed by measuring with an atomic force microscope (AFM) the surface roughness of the semiconductor substrate having been processed up to the step of preinjection. When surface roughness (e.g., average roughness Ra, average root-mean-square of roughness Rrms, or maximum height difference PV) measured with the AFM is plotted with respect to the preinjection time, the surface roughness increases gradually with an elongation of the preinjection time. However, on a border at certain time, the surface roughness turns to decrease. Proper preinjection time is tc or longer. More preferred preinjection time is to be set longer than the time until the surface roughness decreases to the same level as that before the preinjection. Also, as described later, the tc may be determined from changes with time of haze values of the layer surface. Specific time depends on the temperature, pressure, silicon material gas feed rate and so forth at the time of preinjection.

If the non-porous single-crystal silicon formed substantially on the porous silicon layer becomes large in film thickness as a result of the preinjection, the effect attributable to the interbaking may be. More specifically, the smoothing of the surface by heat treatment not only depends on the surface diffusion of surface atoms but also, as an additional effect, depends on the relaxation of strain due to internal stress applied to the whole thin film of non-porous single-crystal silicon formed substantially on the porous silicon layer by the step of preinjection. As for this effect, mechanical strength increases with an increase in the thickness of the non-porous single-crystal silicon thin film, and the effect of strain relaxation attributable to the heat treatment may be hindered. Stated specifically, the preinjection may preferably be completed before the non-porous single-crystal silicon comes to have a film thickness larger than 50 nm, and more preferably 30 nm.

The film thickness of the non-porous single-crystal silicon thin film formed in the step of preinjection may be determined by observing its cross section with a scanning electron microscope or a transmission electron microscope, or by measuring its film thickness by an optical method such as ellipsometry.

Intermediate heat treatment:

The step of intermediate heat treatment (interbaking) which is used in the present invention is to make, after the step of sealing pores, heat treatment at a temperature higher than the sealing step. Carrying out the interbaking enables more improvement in surface roughness of the pore-sealed porous silicon layer surface. This treatment also brings about the effect of relaxing the strain produced in the vicinity of the interface between the porous silicon and the non-porous single-crystal silicon and smoothing the pore-sealed surface. This interbaking does not bring about any high stacking fault density of the non-porous single-crystal layer formed thereon. The crystal defects of the non-porous single-crystal layer formed on the porous layer are almost occupied by stacking faults. When observed from the surface, the stacking faults look equal in size so long as the layer has the same thickness. More specifically, all stacking faults occur in the vicinity of the interface between the porous silicon layer and the non-porous single-crystal layer. The stacking fault density has become fixed in the step of sealing pores, and the stacking fault density changes little upon heat treatment after the step of sealing pores. After this interbaking, the non-porous single-crystal silicon layer, or a non-porous single-crystal semiconductor compound layer, is epitaxially grown at the desired heat treatment temperature.

The temperature at the time of interbaking is so selected as to be higher than the temperature at the time of sealing within the range of from 900° C. to 1,150° C., and more preferably from 1,000° C. to 1,150° C. The interbaking is carried out in an atmosphere which is substantially free of the silicon source gas described above, and which is exemplified by a reducing atmosphere comprising 100% of hydrogen and a reducing atmosphere containing hydrogen diluted with an inert gas such as argon. The pressure may be selected within the same range as the range of pressure selected in the sealing step.

The interbaking brings about the smoothing effect immediately upon reaching the prescribed temperature. Accordingly, the interbaking may be instantaneous heating as in RTA. However, the interbaking time may preferably be longer in order to improve the surface smoothness. Still however, it may preferably be shorter in order to control any structural changes of porous silicon which are caused by heat treatment, i e.g., in order to prevent the pores from dividing because of the aggregation of silicon that may be caused by the heat treatment.

The improvement in surface smoothness is remarkable at the initial stage of the heat treatment, and the degree of improvement decreases exponentially.

Taking account of these, the interbaking time may preferably be 10 minutes or less, more preferably 5 minutes or less, and still more preferably 1 minute or less.

It is observed by five-crystal x-ray diffraction method that when the heat treatment is not conducted, fluctuation of crystal orientation of a layer in the vicinity of a surface of the porous silicon layer and a layer in which surface pores of the porous silicon is sealed is made larger than that of usual single crystal silicon. Since the interbaking decreases the fluctuation, it can be assumed that decrease of fluctuation of crystal orientation contributes to the effect of flattening surface unevenness by interbaking.

Epitaxial growth:

After the interbaking step, epitaxial growth is carried out having no particular restrictions on the growth rate. It may be carried out under the same conditions as those for known growth on bulk silicon. Alternatively, the growth may be continued at the same growth rate as that in the step of feeding materials in a very small quantity, like that in the preinjection step described above, or gas species may be changed; in either case, the achievement of the object of the present invention is by no means obstructed. In the case where the same conditions as those in the step of feeding materials in a very small quantity are selected, the feeding of material gas may be stopped after the preinjection to carry out the interbaking, and the feeding of materials may again be started. Such a method may be employed. In any case, the single-crystal layer is formed until it has the desired thickness.

The growth temperature, pressure and gas flow rate can be controlled independently from the step of preinjection, and hence the growth temperature may be set lower than that in the interbaking step and also in the sealing step so as to keep the porous silicon from structural coarsening and to prevent any impurities such as boron and phosphorus from being auto-doped or solid-phase diffused from the porous silicon. On the contrary, the growth temperature may be set higher and the flow rate of silicon source gas may be made larger to enhance the growth rate so that a thick non-porous single-crystal silicon film can be formed in a short time. Also, the single-crystal layer to be grown may be formed of silicon, or a Group IV material such as SiGe or SiC, or a compound semiconductor as typified by GaAs, GaAsAl, InP or GaN.

In heteroepitaxy, the porous silicon acts as a stress-compliant material and can relax the stress caused by lattice mismatch. Moreover, it can lower the stacking fault density of the non-porous single-crystal silicon layer, and hence can also lower the crystalline defect density of the heteroepitaxially grown layer. So long as the porous layer has been kept from structural changes and coarsening, pore division and so forth, the effect of relaxing stress can be preserved.

For reference, examples of epitaxial growth made on the porous silicon without using the sealing step are described here.

In probably first-time epitaxial growth on porous silicon as reported by T. Unagami et al. (T. Unagami and M. Seki, J. Electrochem. Soc., 125, 1978, p.1340), a porous layer is formed on the surface of a p-type (111) silicon wafer of 0.004 to 0.15 Ω·cm, and thereafter a silicon layer is epitaxially grown at a growth rate of 0.4 μ/minute in a 1170° C. atmosphere of hydrogen, using $SiCl_4$ as a material gas. They report that almost no crystalline defects are seen when observed after defects are actualized by Sirtle etching. However, such high-temperature heat treatment makes the structure of porous silicon greatly coarse and has been unsuitable for the formation of FIPOS structure. Under such circumstances, research reports on the formation of epitaxial layers since the advent of FIPOS have been focused on how both the keeping of porous silicon from structural changes and the formation of an epitaxial layer with a low stacking fault density can be achieved.

Takai et al. (H. Takai and T. Itoh, J. Electronic Materials 12, 1983, p.973, and H. Takai and T. Itoh, J. Appl. Phys. 60, 1986, p.223) have formed a single-crystal silicon layer at a growth rate of 102 nm/minute to 132 nm/minute by plasma CVD making use of $SiH_4$, at 750° C. in order to control the structural changes of porous silicon. Takai et al. report that, when an epitaxial silicon layer is formed on porous silicon by plasma CVD, the pores of the porous silicon become stopped up with an increase in thickness of the epitaxial silicon layer. They estimate that the transition layer where the pores remain is about 150 nm thick.

T. L. Lin et al. (T. L. Lin, S.C. Chen, Y. C. Kao, K. L. Wang and S. Dyer, Appl. Phys. Lett. 48, 1986, p.1793) have made porous the surface of a p-type silicon substrate of 0.01 to 0.02 Ω·cm in resistivity and thereafter have epitaxially grown a non-porous single-crystal silicon layer by Si-MBE at a low temperature of about 750° C. They remove a very-thin oxide film from the surface by irradiation with a very small amount of silicon flux at 750° C., thereafter make deposition up to a thickness of 50 nm at a growth rate of 0.02 nm/second (=1.2 nm/minute) at the initial stage, and thereafter make deposition up to the desired thickness at a growth rate of 0.2 nm/second (=12 nm/minute). Stacking fault density measured by observing etch-pits with a Nomarski differential interference contrast microscope is $1.7 \times 10^3/cm^2$.

Vescan et al. (L. Vescan, G. Bomchil, A. Halimaoui, A. Perio and R. Herino, Material Letters 7, 1988, p.94) have employed LPVPE (low-pressure vapor phase epitaxy). They prepared a porous silicon formed on a p-type silicon substrate of 0.01 Ω·cm and having a porosity of 56% and thinly preoxidize pore sidewalls by dry oxidation at 300° C. for 1 hour (preoxidation). This oxidation treatment is to keep the porous layer from structural coarsening caused by the subsequent epitaxial growth or high-temperature heat treatment such as oxidation treatment. Thereafter, only the oxide film on the porous surface is removed by HF-acid dipping, and then the substrate is set in a growth vessel and baked in ultra-high vacuum of $5 \times 10^{-6}$ mbar. Thereafter, $SiH_2Cl_2$ is fed into the vessel to make epitaxial growth of a non-porous single-crystal silicon layer at a temperature of 900° C. or below. Cross-sectional observation with a transmission electron microscope reveals a dislocation network of about $10^5/cm^2$ in the vicinity of interface. Also, some defects crossing the epitaxial layer are observed.

Oules et al. (C. Oules, A. Halimaoui, J. L. Regolini, R. Herino, A. Perio, D. Benshahel and G. Bomchil, Mater. Sci. Eng., B4, 1989, p.435, or C. Oules, A. Halimaoui, J. L. Regolini, A. Perio and G. Bomchil, J. Electrochem. Soc. 139, 1992, p.3595) report that $SiH_4$ is used as a material gas in a similar LPVPE process after the preoxidation like that of Vescan et al. They make epitaxial growth at 830° C. and 2 Torr using $H_2$ as a carrier gas and $SiH_4$ as a material gas. Growth rate is 0.5 μm/minute. They show that the stacking fault density of the epitaxial silicon layer on the porous silicon formed on a p-type silicon substrate of 0.01 Ω·cm strongly depends on the porosity of the porous layer, and, at a porosity of 50% or less, stacking fault density observed by plane TEM (transmission electron microscopy) is on substantially the same level as stacking faults of the layer epitaxially grown under the same conditions on a bulk silicon wafer (no porous silicon is formed), but they are silent as to its absolute value. Since the measurement region of a sample for observation by conventional plane TEM is about 100 μm square, the lower limit for the measurement of stacking fault density is estimated to be about $10^4/cm^2$, or it may reach $10^3/cm^2$ at best even when fairly detailed observation is made. Also, they assume that the defects remaining in the layer are ascribable to particles or the like arising from a systems problem, and state that detailed evaluation on stacking fault density requires a further experiment made in a clean environment.

As shown in the foregoing, in the epitaxial growth on porous silicon that has been adapted to the FIPOS process, the process temperature must be set low in order to keep the porous silicon from structural coarsening that may obstruct the post-step porous-layer oxidation processing. Accordingly, the epitaxial growth has been limited to the methods such as MBE and LPVPE, which have not come into wide use as means for producing silicon used for LSIs. Thus, few studies have been made on epitaxial growth using CVD systems which carry out growth at a pressure of about 10 Torr to about 760 Torr.

To cope with such circumstances, the present inventors have employed the sealing step and also the intermediate heat treatment (interbaking) step to improve the quality of non-porous layers.

(Embodiment 2)

FIGS. 2A to 2F illustrate a semiconductor substrate production process according to another embodiment of the present invention. To make it easy to understand, pores of porous materials are drawn in cylinders. As well known, actual pores have complicated shapes.

As shown in FIG. 2A, a substrate having a porous silicon layer 11 at least on its one-side surface is prepared. Reference numeral 2 denotes pores, and 3 denotes, pore walls comprised of single-crystal silicon.

Figure 2B:
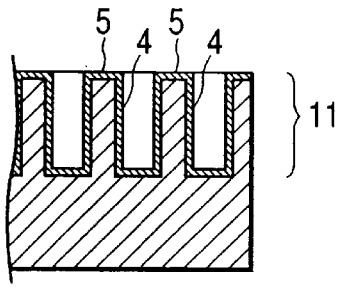

Next, as shown in FIG. 2B, preoxidation treatment described later is carried out to form protective films 4 on the pore wall surfaces. Here, films 5 are also formed on the surface of the porous silicon layer 11.

Figure 2C:
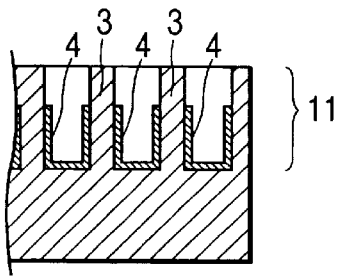

Then, as shown in FIG. 2C, HF-acid dipping (treatment with an aqueous solution containing hydrofluoric acid) described later is optionally carried out to remove at least the protective films 5 from the surface of the porous silicon layer. Here is shown a state where the upper part of the protective films 4 on the pore wall surfaces is also removed simultaneously by the hydrofluoric acid having entered the pores.

Figure 2D:
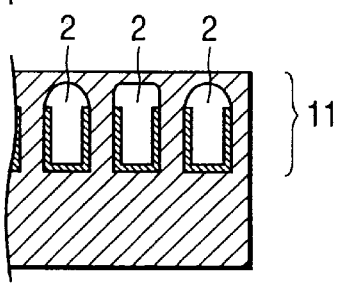

Subsequently, as shown in FIG. 2D, the prebaking described above is carried out to seal up some of the surface pores, and the preinjection described above is further carried out to seal up the surface pores remaining unsealed by the prebaking. The shape of the pore upper part is also diagrammatically drawn in FIG. 2D. Actually, it may have more complicated shapes.

Figure 2E:
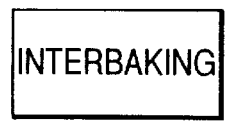

As shown in FIG. 2E, the intermediate heat treatment (interbaking) described above is carried out to improve the surface smoothness of the porous silicon layer 11.

Figure 2F:
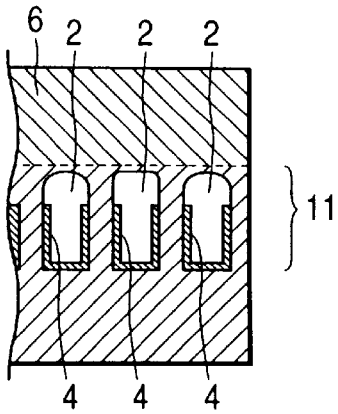

Then, as shown in FIG. 2F, the epitaxial growth described above is carried out to form a non-porous single-crystal layer 6. According to the present embodiment, a non-porous single-crystal layer 6 having a smooth surface is obtained.

The additional steps of preoxidation and HF-acid dipping added in the present embodiment are described below.

Preoxidation:

Before the sealing step, it is preferable to make oxidation treatment (preoxidation) to form protective films on the pore walls of the porous silicon layer.

The thickness of walls between adjoining pores of the porous silicon is as small as 1 nm to 90 nm, and hence the adjoining pores in the porous layer may coalesce to become large and may further become divided as a result of the heat treatment at the time of epitaxial growth and at the time of thermal oxidation of the epitaxially grown layer. For example, in FIPOS, the progress of oxidation of the porous layer is hindered because of an increase in pore wall thickness and the dividing of pores, so that it becomes difficult to oxidize the porous layer completely. Accordingly, after the porous layer has been formed, thin protective films are previously formed on the pore walls by a process such as thermal oxidation so that the pores can be kept from coalesceing to become large.

In the formation of the protective films, especially when formed by oxidation, it is essential to leave single-crystal silicon regions inside the pore walls. It can be enough for the protective films to have a thickness of at least 1 nm. This step may be omitted so long as post steps such as heat treatment after bonding are sufficiently low-temperature controlled and the porous layer is kept from changing structurally.

HF-acid dipping:

In the case where the above preoxidation is carried out, protective films such as silicon oxide films are also formed on the surface of the porous silicon layer. Accordingly, such protective films may be removed as the occasion demands. For example, the protective films may preferably be removed from the porous layer surface by immersing the substrate in a low-concentration aqueous hydrofluoric-acid solution. Sato et al. (N. Sato, K. Sakaguchi, K. Yamagata, Y. Fujiyama and T. Yonehara, Proc. of the Seventh Int. Symp. on Silicon Mater. Sci. and Tech., Semiconductor Silicon, Pennington, The Electrochem. Soc. Inc., 1994, p.443) report that stacking faults can be reduced to a density of about $10^3/cm^2$ by making the time of HF-acid dipping longer. According to further experiments made by the present inventors, HF-acid dipping carried out for a long time may cause the porous layer's structural coarsening to progress depending on the temperature of annealing carried out after bonding. Thus it has been found that the HF-acid dipping time may preferably be controlled within an appropriate range. After the HF-acid dipping, the substrate is washed with water and then dried to lower the concentration of hydrofluoric acid remaining in the pores of the porous layer.

(Embodiment 3)

The embodiment described below is an embodiment in which the sealing step, the intermediate heat treatment (interbaking) and the epitaxial growth step are further improved.

As shown in FIG. 2A, the porous silicon layer 11 is formed. Next, as shown in FIG. 2B, the protective films 4 and 5 are optionally formed. Then, as shown in FIG. 2C, the HF-acid dipping is carried out to remove the protective films 4 and 5 partly.

Under conditions such that the heat treatment provides an etching depth of silicon of 2 nm or less, and more preferably 1 nm or less, the respective steps of sealing, interbaking and epitaxial growth are continuously carried out as shown in FIGS. 2D to 2F.

Thus, a high-quality non-porous single-crystal layer is obtained.

It is commonly pointed out that stacking faults cause deterioration of breakdown strength of oxide films. At present, it is predominantly considered that this deterioration is due to metal impurities deposited at the regions of dislocation that surround stacking faults, where the impurities make the leak current at a p-n junction higher to cause deterioration of the lifetime of minority carriers. Besides, also in the above reports relating to the epitaxial growth on porous silicon, there is no report that the stacking faults are less than $10^3/cm^2$ when measured by the method having a low detection limit in which observation with an optical microscope is made after defects are actualized by etching. The probability that stacking faults of $10^3/cm^2$ to $10^4/cm^2$ are included in the gate region of 1 $\mu m^2$ is as low as 0.0001 to 0.00001, but the stacking fault density is still higher than that of bulk silicon wafer, and its influence is forecasted to commonly appear as the yield of integrated circuits. When SOI wafers obtained by the above process are put into practical use, it has been an important subject to lower such stacking fault density to $1,000/cm^2$ or less.

As the growth process, with spread of production systems, the epitaxial growth made by CVD is preferred in practical use, which can materialize a thickness uniformity of the epitaxial silicon layer at least within ±4%, and within ±2% in the case of a better system.

In the process disclosed by Sato et al. (N. Sato et al., Jpn. J. Appl. Phs. 35, 1996, p.973), referred to previously, the heat treatment temperature is set at a high temperature above 1,100° C. so as to lower the stacking fault density to the mark of $10^2/cm^2$. When, however, such a high-temperature heat treatment is made, the phenomenon that the pores in the porous silicon coalesce to become large and become divided as a result of the heat treatment may occur even if the preoxidation treatment is made in advance.

Apart from this matter, it is also taught that carrying out the HF-acid dipping for a long time immediately before the substrate is put into the growth vessel contributes to the achievement of a low stacking fault density. However, in the HF-acid dipping, the hydrofluoric acid solution may locally deeply enter the porous silicon to remove the very-thin oxide films formed on the pore sidewalls. As a result, this causes local structural coarsening of the porous silicon. It has been undesirable to carry out HF-acid dipping in excess beyond the minimum time or concentration necessary for removing the surface natural oxide film.

More specifically, it is sought to provide a process by which the stacking fault density of the non-porous single-crystal silicon layer formed on the porous silicon can be lowered without use of any excess HF-acid dipping and high-temperature prebaking and without causing the structural coarsening and pore division of the porous silicon layer.

Figure 3:
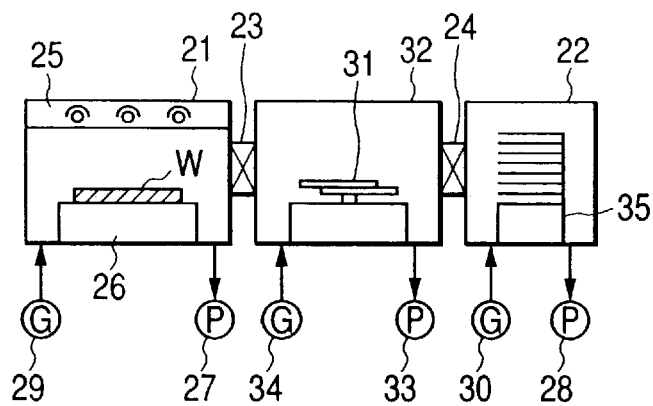
FIG. 3 is a diagrammatic view of a processing system used in the present invention.

FIG. 3 diagrammatically illustrates a processing system usable in the present invention.

Reference numeral 21 denotes a reaction chamber; 22, a load lock chamber; and 32, a transport chamber. Reference numeral 23 denotes a gate valve which divides the reaction chamber 21 from the transport chamber 32, and; 24 denotes, a gate valve which divides the transport chamber 32 from the load lock chamber 22. Reference numeral 25 denotes a heater such as a lamp, for heating a substrate W; 26, a susceptor for placing the substrate W thereon; 27, 28 and 33, exhaust means for evacuating the insides of the reaction chamber 21, load lock chamber 22 and transport chamber 32, respectively; 29, a gas feed means for introducing a processing gas into the reaction chamber 21; 30 and 34, gas feed means for introducing a gas for purging or pressurizing the insides of the load lock chamber 22 and transport chamber 32, respectively. Reference numeral 31 denotes a transport arm for transporting the substrate W in and out of the reaction chamber 21. Reference numeral 35 denotes a wafer cassette.

As a modification, the load lock chamber 22 may be provided integrally with the transport chamber 32 holding the transport arm, without dividing the former from the latter with the gate valve 24.

In the present embodiment, the sealing, intermediate heat treatment and epitaxial growth are processed in the same reaction chamber by the use of the system as shown in FIG. 3. The sealing step comprises a temperature rise, a removal of natural oxide film and the stopping-up of pores. In the present embodiment, the etching depth of silicon (the thickness lost by etching) the temperature rise and the removal of natural oxide film may preferably be controlled to be 2 nm or less, and more preferably 1 nm or less.

Temperature rise:

The substrate on the surface of which the porous silicon layer has been formed is placed in a reactor inside the reaction chamber 21, and thereafter the substrate W is heated to raise its temperature. In an instance where the reactor is made of a light-transmitting material such as quartz, the substrate is heated by infrared lamp irradiation from the outside of the reactor. As other means, induction heating with high-frequency power, resistance heating and so forth are available. Besides the quartz, the reactor may be made of stainless steel.

In the case of an atmospheric open type reactor, into which the substrate W is transported not via the load lock chamber 22, the inside of the reactor is thoroughly purged after the substrate has been transported into it, to remove oxygen content and water content included in the reactor, and thereafter the temperature is raised. The higher the rate of temperature rise is, the more the etching ascribable to the residual oxygen content and water content can be restrained. Hence, the temperature should be raised at a rate as high as possible, preferably at a rate of 1° C./second or higher, and more preferably 5° C./second or higher.

Removal of native oxide film:

The native oxide film having adhered to the porous layer surface is removed by heat treating in a reducing atmosphere containing hydrogen or in ultra-high vacuum. The treatment may be made at a temperature of 600° C. or above. There are no particular limitations on treatment pressure, which may preferably be atmospheric pressure or below.

The natural oxide film is released in the gaseous phase as a result of the reaction:

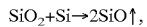

so that the porous silicon surface and the silicon in the vicinity of the surface are etched when the natural oxide film has a large thickness. The natural oxide film herein referred to is meant to be a silicon oxide film formed unintentionally during and after the HF-acid dipping step. Such silicon oxide film is formed during water washing after the HF-acid dipping, during placement in the epitaxial growth system and during the step of raising temperature. Especially when any water content and oxygen content remain during the step of raising temperature, the silicon is oxidized concurrently with the rise of temperature to inevitably form the silicon oxide film. As a result, it follows that the silicon oxide thus formed reacts with adjacent silicon to etch the silicon.

The larger the thickness the silicon oxide film formed during the rise of temperature has, the longer the time the heat treatment requires to completely remove the silicon oxide film formed. Such heat treating made for a long time is not preferable because the structural changes of the porous silicon surface may progress as described later.

Taking account of the foregoing, the above temperature rise and removal of native oxide film may be carried out under conditions such that the etching depth of silicon in these two steps preferably is to be 2 nm or less, and more preferably 1 nm or less. The fact that the etching depth of silicon is small indicates nothing but that the degree of oxidation of silicon in the system is low.

The reason therefor is explained below on the basis of experimental results.

The present inventors have found that the amount of the silicon etched away from the substrate surface after the substrate having the porous silicon formed thereon is placed in the epitaxial growth system and until the silicon material gas is fed into the reactor and the formation of non-porous single-crystal silicon is started, has an important relation to the inclusion of stacking faults in the non-porous single-crystal silicon.

Figure 4:
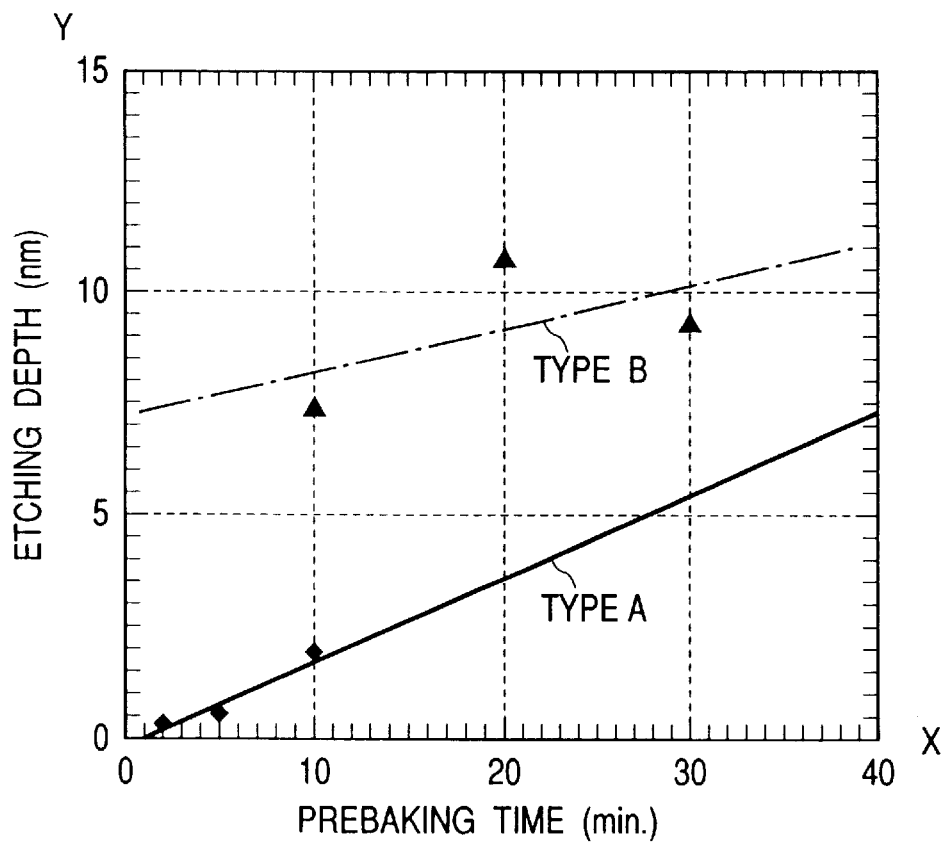
FIG. 4 shows the relationship between prebaking time and etching depth when a processing system usable in the present invention is used.

FIG. 4 shows the time dependence of the thickness loss due to the etching of the surface of non-porous single-crystal silicon in two types of systems. Type A is an instance where a system having the reaction chamber fitted with a load lock chamber as shown in FIG. 3 is used in this system an SOI silicon wafer is subjected to heat treatment at 1,100° C. in a 600 Torr atmosphere of hydrogen. Type B is an instance where a barrel type system having an atmospheric open type reaction chamber having no load lock chamber is used; in this system, an SOI silicon wafer is subjected to heat treatment at 1,050° C. in a 760 Torr atmosphere of hydrogen. The etched thickness is determined by measuring the thickness loss of the semiconductor layer on insulating layer, i.e., the SOI layer. The reason why the pressures are a little different is that the respective systems have different optimum conditions.

In Type B, the etching depth on the Y-side (time: 0) is as much as 7 nm. This means an etching depth where the substrate temperature is raised to 1,050° C. and dropped immediately thereafter. The thickness of silicon is lost by nearly 7 nm only upon the raising of temperature. In Type A, on the other hand, little change is seen on the etching depth at the time "0". This difference is explained by the oxidation of silicon in the step of raising temperature, ascribable to the oxygen content and water content in the reactor, and by the etching of silicon oxide formed.

The oxygen content and water content in the reactor depends on the purity of the gas to be fed, the water content adsorbed in feeding pipes, the micro-leak, the leak-tightness of the reactor itself, and their inclusion into the reactor during the transport of substrates. The inclusion of oxygen content and water content during the transport of substrates depends greatly on whether the substrate is introduced into the reactor via the load lock chamber or the substrate is directly transported after the reactor is opened to the atmosphere. However, even when the reactor is opened to the atmosphere, the gas inside the reactor may be displaced taking a sufficiently long time without raising the temperature thereafter, whereby the concentration of residual oxygen content and water content can be made lower. This, however, is not suitable for mass production due to a poor efficiency. The etching depth is also affected by the time necessary for the temperature to be raised to the preset temperature, and hence it is desirable for the rate of temperature rise to be enhanced using a substrate holder having a small heat capacity. The controlling of such silicon etching depth can also be achieved by controlling the quantity of residual oxygen content and water content in the reactor during the rise of temperature at the time of heat treatment and during the removal of natural oxide film. To control the quantity of residual oxygen content and water content in the reactor, it is effective for the inner surfaces of the reactor to be prevented from direct contact with the atmosphere by controlling the oxygen content and water content in the gas species to be fed and by transporting the substrate in and out of the reactor through the load lock chamber.

In the case where the CVD process employed widely as a process for the epitaxial growth of silicon is used, it is desirable to install a carrier gas hydrogen purifier in the vicinity of the system. Also, the air-tightness of the piping system and reactor may be made much higher. It is also preferable to use hydrogen fluoride gas in the course of the removal of natural oxide film described above. The treatment with hydrogen fluoride gas may or may not be employed so long as the silicon etching depth is controlled within the range stated above. In addition, it is better for the prebaking time to be shortened so that the etching depth does not become greater than 2 nm.

Figure 5:
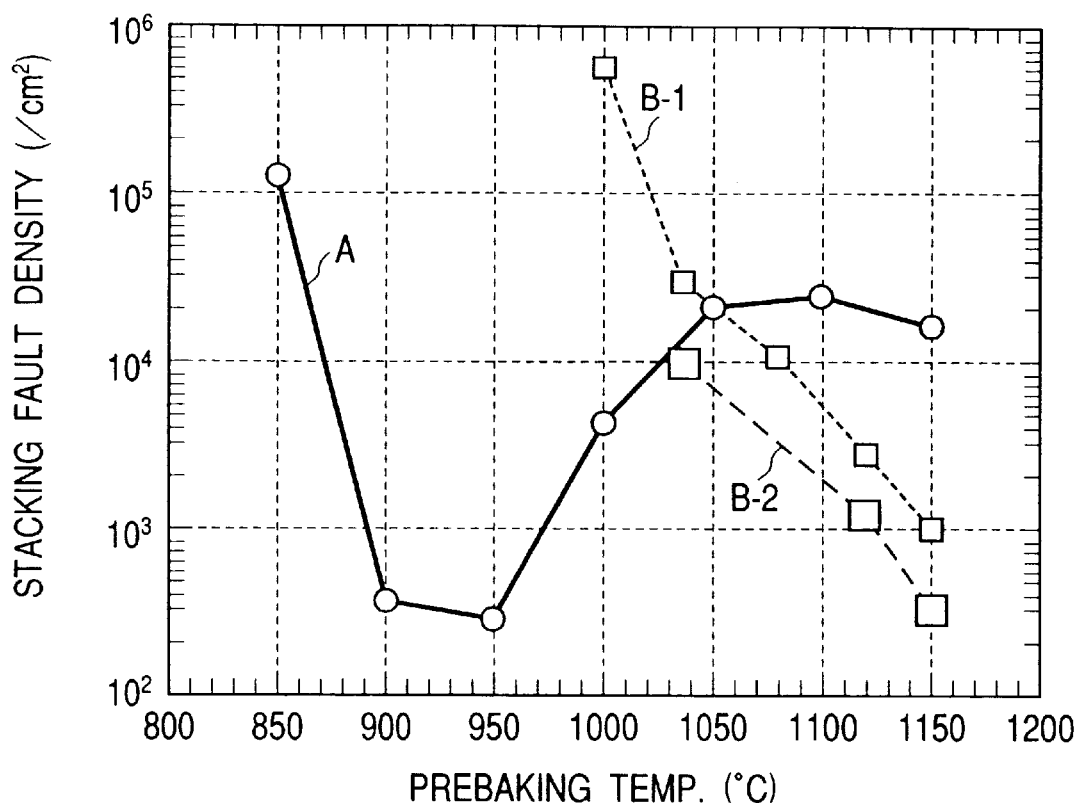
FIG. 5 shows the relationship between prebaking temperature and stacking fault density.

FIG. 5 shows data obtained in these Types A and B by comparing the dependence of stacking fault density on prebaking temperature; the former being the density of stacking faults included into the non-porous single-crystal silicon formed on the porous silicon and the latter being the temperature before the epitaxial growth.

Type B-1 and B-2 concern the data obtained when the same processing system as that in the above Type B reported by Sato et al. (N. Sato et al., Jpn. J. Appl. Phs. 35, 1996, p.973) is used. The stacking faults decrease with the increase of prebaking temperature before the epitaxial growth. Also, Type B is the one in which the growth rate is extremely controlled by feeding the silicon source gas in a small quantity at the growth initial stage. In Type B-2, compared with Type B-1, the stacking fault density is lowered to about ⅓ without dependence on the temperature. In either case, however, the stacking fault density is lowered by setting the heat treatment temperature to a high temperature as stated previously, and hence the structural coarsening of porous silicon and the pore division inevitably occur.

In Type A, on the other hand, the stacking fault density is on the mark of $10^4/cm^2$ in the temperature region above 1,000° C., where the stacking fault density is not lowered as remarkably as in Type B even when the heat treatment temperature is raised. However, as the temperature is dropped, the minimum value of stacking fault density appears around 950° C. The stacking fault density is lowered to about $10^2/cm^2$ at 950° C. Namely, in Type A, in which the silicon etching depth is small, the stacking fault density can be lowered at a low temperature without causing the structural changes and coarsening of porous silicon. The fact that the stacking fault density assumes the minimum value in the low-temperature region has been found for the first time by the present inventors.

This can be explained in the following way. In Types B-1 and B-2, in which the silicon etching depth is large, the silicon oxide is formed on the silicon surface during the temperature rise because of the residual oxygen and water content. In the low-temperature region, the silicon oxide formed m can not completely be removed, and hence a high stacking fault density results. The silicon oxide formed is removed by making the heat treatment temperature higher or making the time sufficiently longer, so that the stacking fault density begins to lower.

Continuing the prebaking causes the migration of surface atoms to take place at the porous silicon surface, which becomes free from microscopic roughness and obtains a smooth surface so as to lower the surface energy, and the majority of surface pores is sealed and disappear.

In Type A, the substrate having the porous silicon layer formed thereon was subjected only to the prebaking and thereafter taken out of the reactor and observed with a high-resolution scanning electron microscope (HR-SEM).

The porous silicon used as an evaluation sample was prepared by carrying out anodizing in an $HF/C_2H_5OH/H_2O$ mixture solution, followed by heat treatment at 400° C. for 1 hour in an atmosphere of oxygen. It was dipped in an aqueous 1.25% by weight hydrofluoric acid solution for about 25 seconds, followed by water washing and then drying. Thereafter, the resulting substrate was placed in the same processing system as that of Type A.

Figure 6A:
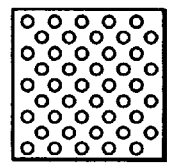
FIGS. 6A, 6B and 6C are diagrammatic views showing how surface pores distribute at the surface of a porous silicon layer.

FIG. 6A diagrammatically illustrates an SEM image of the porous silicon surface standing immediately before the substrate is placed in the system. Pores of about 10 nm in diameter are formed in a density of $10^{11}/cm^2$.

Figure 6B:
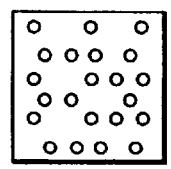

An SEM image of the porous silicon surface only subjected to heat treatment at 950° C. and 600 Torr for 2 seconds is shown in FIG. 6B. Pore density is a little low, but still on the mark of $10^{10}/cm^2$.

Figure 6C:
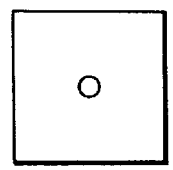
Figure 11A:
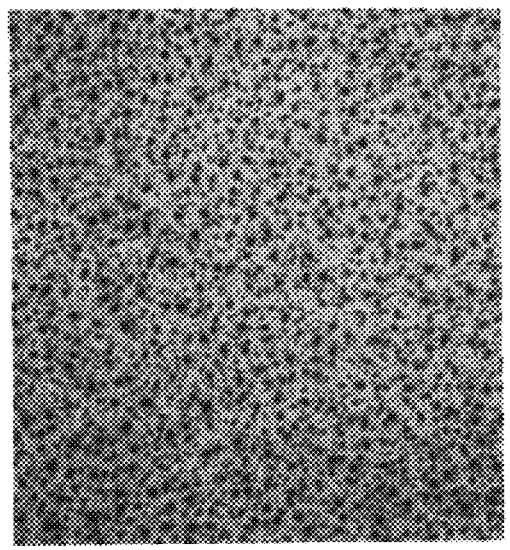
FIGS. 11A, 11B and 11C are images obtained by scanning electron microscope, corresponding to FIGS. 6A, 6B and 6C, respectively.
Figure 11B:
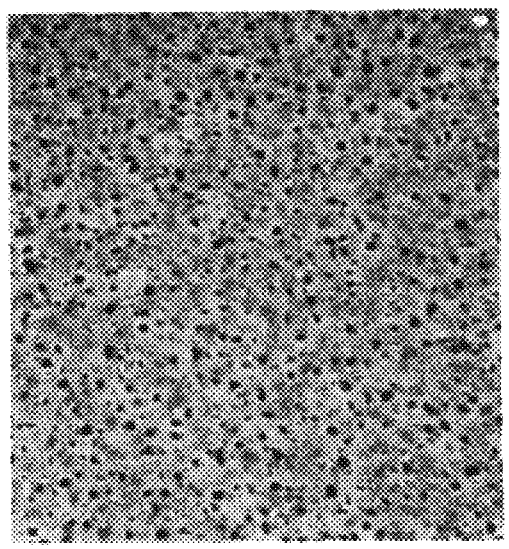
Figure 11C:
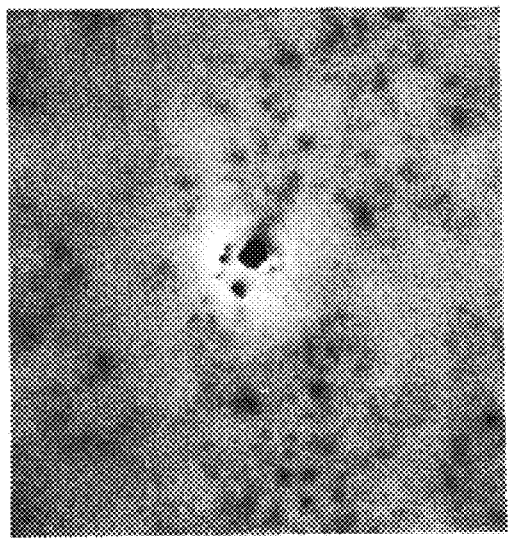

On the other hand, observation of the porous silicon surface having been treated at 1,100° C. for 2 seconds revealed that the pore density was lowered greatly to about $10^6/cm^2$. The remaining pores having remained had become large in pore diameter as shown in FIG. 6C. FIGS. 11A to 11C show scanning electron microscope (SEM) images corresponding to FIGS. 6A to 6C, respectively.

The pore diameter becomes large as a result of the oxidation ascribable to residual oxygen and water content, the etching, the enlargement due to diffusion of surface atoms and the coalescence of adjoining pores.

Next, how the non-porous single-crystal layer formed on the porous silicon influences the stacking faults was examined.

Evaluation of stacking fault density:

In the CVD epitaxial growth system fitted with the load lock chamber as shown in FIG. 3, a susceptor comprising a carbon substrate covered with a CVD-SiC film was kept heated to 750° C., and a silicon wafer having porous silicon formed thereon was transported via the load lock chamber and placed in the reactor. Thereafter, prebaking where the temperature was raised to 900° C. at a rate of 100° C./minute and maintained at 900° C. for 2 seconds was carried out under conditions of 600 Torr and 43 liter/minute of hydrogen.

The temperature of the sample having been prebaked was dropped to 750° C. at a rate of 100° C./minute, and the wafer was taken out via the load lock chamber, where the surface pores of the porous layer, in which pores of about 10 nm in average diameter had been in a pore density of $10^{11}/cm^2$ before the heat treatment, were reduced to a density of $10^{10}/cm^2$. Pore diameter remained 10 nm.

After the above prebaking, in the reactor, $SiH_4$ was continuously added for a prescribed time in a concentration of 28 ppm, and thereafter the flow rate of $SiH_4$ was increased to carry out epitaxial growth of a non-porous single-crystal silicon layer with the desired layer thickness. This non-porous single-crystal silicon layer had a stacking fault density of $10^2/cm^2$.

For comparison, the prebaking was carried out at a temperature of 1,100° C., where the surface pores of the porous layer, in which pores of about 10 nm in average diameter had been in a pore density of $10^{11}/cm^2$ before the heat treatment, were brought down to a density of $10^6/cm^2$, and also the pore diameter had enlarged to 20 to 40 nm. Under such conditions, further subsequent to the heat treatment, silicon source gas was added to hydrogen gas to carry out epitaxial growth of the single-crystal silicon layer. As a result, its stacking fault density was $10^4/cm^2$.

The porous silicon has a large in-plane tensile stress as a result of the prebaking and has a lattice constant greater than that of single-crystal silicon. This tensile stress concentrates on the edges around pores remaining in the porous silicon, to make the lattice constant still greater, so that the stacking faults due to lattice mismatch tend to get included. The pores of the porous silicon surface are in an average pore distance of about 30 nm when the pore density is $10^{11}/cm^2$. In the case of this distance, which is not sufficiently large with respect to the pore size of 10 nm to 20 nm, a plurality of pores influence themselves mutually, so that the concentration of stress on the edges around pores is relaxed. On the other hand, when the pore density is $10^{10}/cm^2$, the average pore distance is 100 nm and also when the pore density is $10^9/cm^2$, the average pore distance is 300 nm. In such instances where the distance is sufficiently large with respect to the pore size, it is considered that the effect of relaxing the concentration of stress on the edges around pores that is attributable to the mutual action of pores is minimal, so that the stacking faults tend to be included at the part of the residual pores. Thus, it has become apparent that the pore density and pore diameter influence the stacking fault density in the non-porous single-crystal silicon layer formed on the porous silicon.

Taking account of this fact, it is found that more desirably the surface pore density should not be made too low. To this end, it is better for the prebaking to be carried out at a low temperature.

The pressure also influences the surface diffusion of silicon atoms and change in quality of pore structure at the porous silicon surface and influences the stacking fault density. The lower the pressure is, the more the region where the stacking fault density is lowered appears in a low-temperature region. Two typical sets of data are shown in FIG. 7.

It is also a new discovery that the stacking fault density is lowered to $10^2/cm^2$ when the addition of a silicon source, i.e., the preinjection or epitaxial growth is started before the surface pores become greatly deformed and expanded as a result of the surface diffusion of silicon atoms.

As the prebaking is continues, the majority of the surface pores becomes sealed up and disappear. Since, however, the porous silicon is in itself short of silicon atoms per unit area in accordance with its porosity, it is relatively difficult to stop up all the pores, and pores remaining unsealed (residual pores) tend to be present. Also, the stress acting between the porous silicon layer and the non-porous single-crystal silicon substrate makes the crystal lattice of the porous silicon surface undergo strain. When the pore density is lowered, this strain concentrates on the edges around the residual pores, and hence the stacking faults are likely to be included at the part of the residual pores. Accordingly, in the prebaking, before the surface pore density becomes too low, it is preferable to pass to the next step of adding a silicon source like the step of preinjection.

For example, it is preferable to pass to the step of preinjection at such a timing that the surface of the porous silicon layer has a surface pore density or a haze, satisfying the following relationship. The resultant prebaking time is fairly shorter than conventional prebaking.

The prebaking may preferably be carried out under conditions that satisfy:

$1 \geq \alpha \geq 1/10,000$, and more preferably $1 \geq \alpha \geq 1/100$ when the rate of change in surface pore density of the porous silicon layer is represented by α which is the value of (surface pore density immediately after prebaking)/(surface pore density before prebaking); or under conditions that satisfy:

$1 \leq \beta \leq 3.5$, and more preferably $1 \leq \beta \leq 2$ when the rate of change in haze of the porous silicon layer is represented by β which is the value of (haze immediately after prebaking)/(haze before prebaking).

At the time of preinjection, $SiH_4$ addition time was changed in several ways to form single-crystal silicon layers, and their stacking fault densities were measured. Samples were prepared in the same manner as the samples used to evaluate the stacking fault density. Results obtained are shown in FIG. 8.

Figure 8:
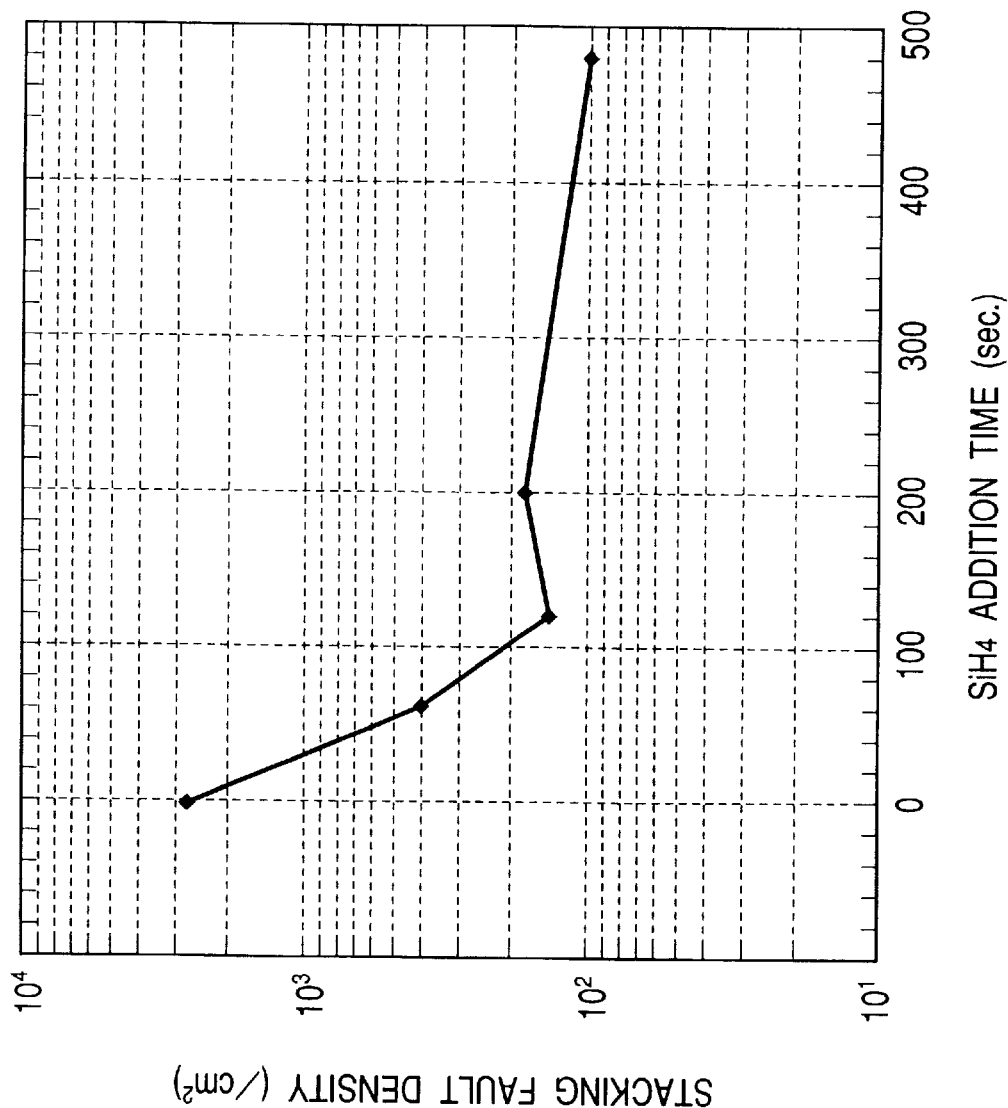
FIG. 8 shows the relationship between silicon gas addition time and stacking fault density in preinjection.

As can be seen from FIG. 8, the addition of $SiH_4$ makes the stacking fault density lower. In particular, the preinjection may preferably be carried out for 100 seconds or more.

The time of preinjection may be set in accordance with the results of measurement of the haze, obtained by observing it with an electron microscope. The haze can be determined by measuring the intensity of scattered light when parallel rays of light such as laser light are made incident on the substrate surface. It can simply be measured with a commercially available foreign matter detector making use of laser light. The laser light may have a wavelength of, e.g., 488 nm of an argon laser. Such a short wavelength is preferred. The shorter the wavelength is, the less deeply the light enters the porous layer. Hence, any structural changes which occur in the vicinity of the porous layer surface and directly affect the crystallizability of epitaxially grown layers can sharply be detected. Also, the light can enter the porous layer less deeply when made incident at a larger angle, i.e., when made incident at a narrower angle with respect to the substrate surface. This makes it possible to sharply measure the structural changes occurring in the vicinity of the surface.

The preinjection was carried out while changing the $SiH_4$ addition time in several ways. Thereafter, substrates were taken out of the epitaxial growth system to measure the haze. Results obtained are shown in FIG. 9.

In the preinjection, the haze shows a tendency to increase with time and decrease thereafter. In the present embodiment, it is effective in the preinjection to continue feeding the silicon source gas until the haze passes over the maximum value. In the case of FIG. 9, the preinjection would preferably be carried out for 120 seconds or more. The upper limit may appropriately be set in accordance with the throughput of the necessary treatment.

To summarize the foregoing description, in the present embodiment, the stacking fault density can be lowered from the conventional mark of $10^4/cm^2$ to a much lower value by carrying out the steps of raising temperature and removing natural oxide film, within the range where the silicon etching depth comes to be 2 nm or less, and more preferably 1 nm or less, after the substrate having porous silicon is placed into the processing system. The stacking fault density that can be achieved by the present embodiment is $1 \times 10^3/cm^2$ or less, and further $10^2/cm^2$ or less.

Of course, needless to say, the smoothness of the non-porous single-crystal layer surface is improved by interbaking.

In the present embodiment, the substrate having the porous silicon layer is placed in the system in which the silicon is etched in a small depth, and the prebaking time before the epitaxial growth is controlled. This can lower the stacking fault density without any high-temperature prebaking conventionally carried out, and hence the porous-layer structural coarsening and pore division may occur to small extent.

In other words, in the present embodiment, the quantity of the natural oxide film inevitably formed in the epitaxial growth system during, e.g., the step of raising temperature, is controlled so that the pore diameter can be kept from becoming large. Also, the heat treatment for removing the natural oxide film is carried out in a shorter time and at a lower temperature, and the pores are sealed by starting the preinjection or the formation of the non-porous single-crystal silicon layer before the surface pores are mostly sealed because of the diffusion of porous surface atoms. Thereafter the intermediate heat treatment (interbaking) is carried out so that the strain remaining in the vicinity of the interface between the porous layer and the non-porous single-crystal silicon layer is relaxed to obtain on the porous silicon the epitaxial silicon layer having a stacking fault density of $10^3/cm^2$ or less and having a good surface smoothness.

(Embodiment 4)

The present embodiment is an embodiment in which a substrate having a non-porous single-crystal layer on a porous silicon layer is produced in the same manner as in Embodiments 1 to 3 and thereafter bonded to an additional substrate and the porous silicon layer is removed while leaving the non-porous single-crystal silicon layer on the additional substrate to produce a composite substrate.

Figure 10A:
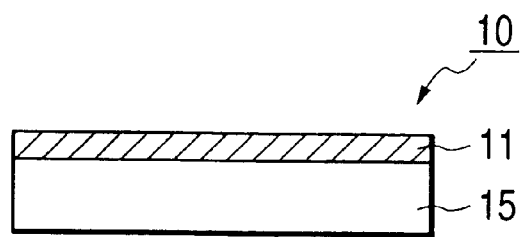
FIGS. 10A, 10B, 10C, 10D and 10E illustrate a semiconductor substrate production process according to still another embodiment of the present invention.

As shown in FIG. 10A, a substrate 10 having a porous silicon layer 11 at least on the surface side is prepared.

Figure 10B:
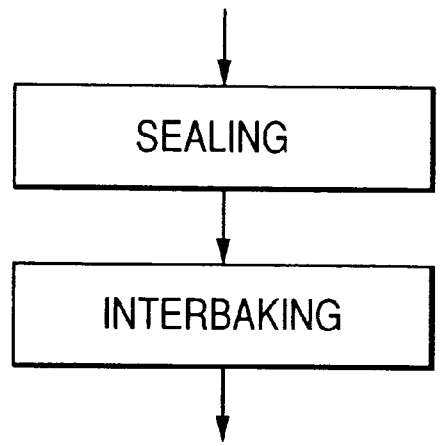

Next, as shown in FIG. 10B, the porous silicon layer is subjected to sealing treatment and thereafter intermediate heat treatment (interbaking) as described previously.

Figure 10C:
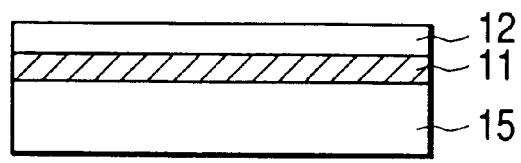

Then, as shown in FIG. 10C, epitaxial growth is carried out to form a non-porous single-crystal layer 12.

Figure 10D:
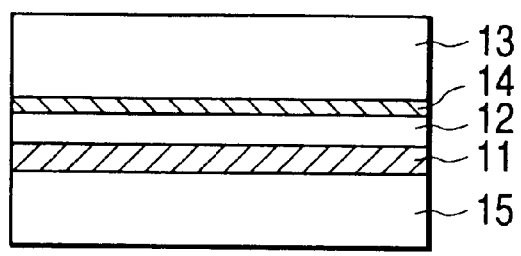

Thereafter, as shown in FIG. 10D, the non-porous single-crystal layer 12 is bonded to an additional substrate 13 optionally via an insulating layer 14 between them to obtain a multi-layer structure.

Figure 10E:
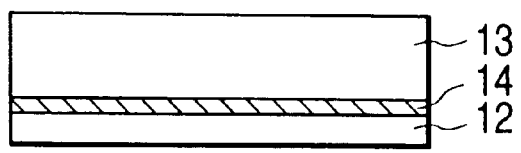

Next, as shown in FIG. 10E, the unnecessary part is removed from the multi-layer structure. More specifically, the porous silicon layer 11 and the non-porous part 15 are removed from the multi-layer structure.

In the present embodiment, since the porous layer has been kept from undergoing structural change and coarsening and pore division, the selectivity may deteriorate less in selective etching used when the porous silicon layer 11 is removed. Also, since the SOI layer according to the present embodiment is formed by epitaxial growth, it does not contain any COP, regarded as killer defects in silicon wafers produced by the CZ (Chochralski) process.

In the bonding carried out in the present embodiment, there are no particular limitations on the additional substrate to which the non-porous single-crystal silicon layer formed on the porous silicon is bonded. It may be any of those having a smoothness which enables close contact with the non-porous single-crystal layer surface or any film formed thereon, as exemplified by silicon wafers, silicon wafers having thermal silicon oxide films formed thereon, transparent substrates such as quartz wafers, and sapphire wafers.

The non-porous single-crystal layer 12 may also be bonded directly to the surface of the additional, second substrate, or may be bonded via an insulating film like the insulating layer 14 shown in FIG. 10D. In the latter case, the film may preferably be formed on at least one of the surface of the non-porous single-crystal layer and the surface of the second substrate before bonding. The film to be formed may be a film of silicon oxide or silicon nitride. In place of such an insulating film, a single-crystal film of SiGe, SiC, a Group III-V compound or a Group II-VI compound may be formed, or films of any of these materials may be layered in plurality.

Before the bonding, it is preferable to well clean the bonding surfaces well. The cleaning may be made by employing a cleaning step used in conventional semiconductor processing. Also, plasma treatment such as irradiation by nitrogen plasma may be carried out before the bonding so that the bonding strength can be improved.

After the bonding, heat treatment may preferably be made to more improve the bonding strength.

After the bonding strength has been made high enough to be endure subsequent steps, the subsequent steps are started. The non-porous part 15 on the back of the substrate 10 having the porous layer formed thereon is removed by mechanical means such as grinding or chemical means such as etching to uncover the porous silicon layer 11. Alternatively, the non-porous part 15 on the back of the substrate 10, remaining without being made porous, may be removed by separating it at the inside of the porous layer and/or at the interface between the non-porous part and the porous layer to uncover the porous layer. This part may be separated mechanically by, e.g., inserting wedges from edge faces, or may be separated by utilizing ultrasonic waves or thermal stress. It is also preferable to separate it by blowing a fluid against the sidewalls of the multi-layer structure to break the porous layer. As the fluid, it is preferable to use, e.g., liquid or gas, more preferably a water jet. Alternatively, a highly porous layer having a low mechanical strength may be formed in the porous layer in advance so that the non-porous part can be separated with ease.

In addition, it is preferable to provide a porous-layer constitution having a first porous region with a high porosity and a second porous region with a low porosity provided on the first porous region, and thereafter an epitaxial layer is formed on the second porous region, taking acount of obtaining an epitaxial layer with a little stacking fault and easy separation. Here, the high porosity is about 30% to 70%, and the low porosity is about 10% to 30%.

The porous layer thus uncovered or porous layer partially remaining may optionally be removed by selective etching. As an etchant for the selective etching, an $HF/H_2O_2/H_2O$ mixture solution may preferably be used. In order to remove air bubbles formed during the reaction, ethyl alcohol, isopropyl alcohol or a surface-active agent may be added to the mixture solution.

Unevenness that reflects the frequencies of pores and sidewalls of the surface porous silicon is present on the surface (of the non-porous layer 12) from which the porous silicon has been removed. This is because this surface corresponds to the interface between the non-porous single-crystal silicon and porous silicon, where the both are single-crystal silicon in themselves and differ only in whether or not they have pores. This surface unevenness may be removed by polishing. It, however, may preferably be subjected to heat treatment in a reducing atmosphere containing hydrogen, whereby the unevenness can be removed and the surface can be made smooth almost without loss of the thickness of the non-porous single-crystal silicon layer.

Meanwhile, the crystallizability of the epitaxial layer on the porous silicon is commonly much better when $p^+$-type silicon (0.01 $\Omega$·cm, boron-doped) is made porous, as opposed to when $p^-$-type silicon is anodized, but there is a possibility that high-concentration boron is auto-doped or solid-phase diffused at the time of epitaxial growth to diffuse into the epitaxial silicon layer. The boron having diffused into the epitaxial silicon layer also remains after the porous silicon has been removed and may cause a difficulty in the controlling of impurity density of active layers in SOI. In order to solve this problem, as proposed by Sato et al. (N. Sato and T. Yonehara, Appl. Phys. Lett. 65, 1994, p.1924), the substrate in which the SOI structure has been completed is annealed in an atmosphere of hydrogen so that the natural oxide film on the SOI layer surface where the boron diffuses at a low rate can be removed, and the boron in the SOI layer is made to diffuse outside so that the boron can be made low-density.

However, any excessive diffusion of boron into the epitaxial silicon layer may cause the boron to be incorporated into the buried oxide film and may make hydrogen annealing time longer to cause some problems such that a high process cost results and the boron density in the buried oxide film can not be satisfactorily controlled. To solve such problems, it is effective to keep the boron from diffusion by forming the epitaxial silicon layer under low-temperature conditions. According to the present invention, the conditions for forming the epitaxial silicon layer can be set independently from the stopping-up of pores. Hence, for the formation of epitaxial silicon layers, appropriate conditions can be set over a wide range.

In the present embodiment, low-temperature baking can be employed, and hence the strain that may remain in the vicinity of the interface between the porous silicon and the non-porous single-crystal silicon can be relaxed to materialize smooth surface properties. Thus, when used in the bonding, the smoothness of the bonding interface can be improved.

(Embodiment 5)

The substrate obtained in Embodiments 1 to 3 described above is prepared, comprising the porous silicon and the non-porous single-crystal silicon layer formed thereon.

The SOI structure is formed by the FIPOS process, i.e., the process in which the single-crystal layer epitaxially grown is partly removed and thereafter oxidation treatment is carried out to oxidize the porous silicon layer selectively.

In the present embodiment, the porous layer has been kept from structurally changes and coarsening and pore division, and hence the selectivity may deteriorate less in the selective oxidation.

(Embodiment 6)

The substrate obtained in Embodiments 1 to 3 described above is prepared, comprising the porous silicon and the non-porous single-crystal silicon layer formed thereon.

Any desired dopant is diffused in the single-crystal layer to produce MOS transistors or bipolar transistors.

The porous silicon has the action of gettering, and hence, even without forming the SOI structure, active layers such as MOS transistors or bipolar transistors may directly be formed by utilizing the non-porous single-crystal layer, thus the resistance to contamination by impurities such as contamination by metals can be improved.

The present invention will be described below by giving Examples.

EXAMPLE 1

950° C., 600 Torr Prebaking (2 or 120 sec.) and Preinjection/1,100° C. Interbaking (10 sec.)/2 $\mu$m Epitaxy:

1) Six-inch (100) $p^+$-type CZ silicon wafers were prepared to which boron was added as a p-type impurity and which were made to have a resistivity of 0.015 $\Omega$·cm±0.005 $\Omega$·cm.

2) In a solution prepared by mixing hydrofluoric acid of 49% by weight of HF (hydrogen chloride) and ethyl alcohol in a ratio of 2:1, the above silicon wafers were set as the anode and a platinum plate of 6 inches diameter was set as the cathode in such a way as to face the silicon wafers. The back sides of the silicon wafers were made to face the front sides of other $p^+$-type silicon wafers via the same solution. A platinum plate of 6 inches diameter was made to face the wafer positioned at the farthest end. The wafers were so disposed that the solution lying between wafers was separated by the wafers preventing conduction between one another. An electric current was flowed across the silicon wafer anode and the platinum cathode at a current density of 10 mA/cm$^2$ for 12 minutes to anodize the silicon wafers. Thus, a porous silicon layer of 12 $\mu$m thick was formed on each wafer surface.

3) Subsequently, the wafers having porous silicon layers formed thereon were subjected to oxidation treatment for 1 hour in a 400° C. atmosphere of oxygen. Since only an oxide film of 5 nm thick or smaller is formed by this oxidation treatment, silicon oxide films are formed only on the surface and pore sidewalls of the porous silicon layer, and regions of single-crystal silicon are left inside the pore sidewalls.

4) To hydrofluoric acid prepared by diluting HF with water to a concentration of 1.25% by weight, the wafers were exposed for about 30 seconds, and then immersed in pure water for 10 minutes to carry out overflow rinsing to remove the very thin silicon oxide films formed on the porous layer surfaces.

The following Steps 5) to 7) are steps for reference.

5) A CVD epitaxial growth system was used which has a load lock chamber, a transport chamber having a wafer transporting robot set therein, and a processing chamber, connected in sequence. In the load lock chamber of this system, SOI substrates previously prepared were placed in the state they were put in a wafer carrier; the substrates having been subjected to HF-acid dipping, washed with water and then dried, were subjected to layer thickness measurement of their SOI layers being measured with a light interference layer thickness meter. The load lock chamber standing at atmospheric pressure was evacuated to 1 Torr or below by means of a dry pump. Thereafter, $N_2$ was flowed therein and the internal pressure was set to 80 Torr. The transport chamber was previously kept at 80 Torr by flowing $N_2$. In the processing chamber, a susceptor comprising a carbon substrate covered with a CVD-SiC film was placed in order to hold the wafer. The susceptor was previously heated with an IR lamp to about 750° C. Into the processing chamber, hydrogen gas purified by means of a hydrogen purifier making use of a heated palladium alloy was previously fed through an inner-wall-polished stainless steel pipe of about 10 m long.

The wafers were transported from the load lock chamber into the processing chamber through the transport chamber by means of the transport robot, and were placed on the susceptor.

6) After the pressure inside the processing chamber was set to 600 Torr, the wafers placed on the susceptor were heated with the IR lamp to raise their temperature at a rate of 100° C. per minute and were kept at 950° C. for 2 seconds. Thereafter, the temperature was dropped to 750° C., and the wafers were taken out through the transport chamber into the load lock chamber again by means of the transport robot. Another wafer was kept at 950° C. for 120 seconds. Except for this, the wafer was subjected to the same treatment and then returned to the load lock chamber.

7) These wafers were taken out of the load lock chamber. The thickness of the SOI layers was again measured to find that the loss of thickness of the SOI layers was less than 1 nm in all the wafers.

8) The wafers having been made porous and on which the treatment of step 4) had been completed were transported into the processing chamber of the epitaxial growth system described above.

9) After the pressure inside the processing chamber was set to 600 Torr, the wafers placed on the susceptor were heated with the IR lamp to raise their temperature at a rate of 100° C. per minute and were kept at 950° C. for 2 seconds as the prebaking. Thereafter, $SiH_4$ was added to hydrogen carrier gas so as to be in a concentration of 28 ppm to accomplish the preinjection treatment for 200 seconds, where the addition of $SiH_4$ was stopped. Thereafter, in the $H_2$ carrier gas, the temperature was raised to 1,100° C. to interbake for 10 seconds. Then, the temperature was dropped to 900° C., and this time $SiH_2Cl_2$ was added in a large quantity so as to be in a concentration of 0.5 mole %, and the pressure was set at 80 Torr, where the non-porous single-crystal silicon layer was formed in a thickness of 2 $\mu$m. Thereafter, the temperature of 900° C. was dropped to 750° C. in an atmosphere of hydrogen, and the wafers were taken out through the transport chamber into the load lock chamber again by means of the transport robot.

On another wafer, prebaking in the 950° C. hydrogen atmosphere was carried out for a time of 120 seconds. Except for this, the wafer was subjected to the same treatment and then returned to the load lock chamber. This prebaking time satisfies the preferred conditions $\alpha$ and $\beta$ described previously.

10) The wafers on which the treatment of step 9) had been completed were subjected to defect-actualizing etching. The crystal defects included into the non-porous single-crystal silicon layer were thus actualized and thereafter observed with a Nomarski differential interference contrast microscope. The defects observed were occupied by stacking faults by 99% or more. The stacking faults were in a density of 84 $cm^{-2}$ in the case of prebaking for 2 seconds, and 160 $cm^{-2}$ in the case of prebaking for 60 seconds. Thus, it was dramatically lowered compared with a density of $1.5 \times 10^4/cm^2$ which was in the case of prebaking at 1,100° C. for 120 seconds. In particular, in the case of prebaking at 950° C. for 2 seconds, a stacking fault density lower than 100 $cm^{-2}$ was attained.

11) The surface roughness of the wafers on which the treatment of step 9) had been completed was measured with an atomic force microscope to find that the surface roughness (Rrms) in the region of 20 $\mu$m square was 0.2 nm in all wafers, which was as good as that of commercially available silicon wafers. On the other hand, in an instance where no interbaking was applied, the surface roughness was 0.35 nm.

EXAMPLE 2

950° C., 600 Torr Prebaking (2 sec.) and Preinjection/1, 100° C. Interbaking (30 sec.)/0.32 $\mu$m Epitaxy/Bonding Etch Back:

1) Eight-inch (100) $p^+$-type CZ silicon wafers were prepared to which boron was added as a p-type impurity and which were made to have a resistivity of 0.015 $\Omega \cdot cm \pm 0.01$ $\Omega \cdot cm$.

2) In a solution prepared by mixing hydrofluoric acid of 49% by weight and ethyl alcohol in a ratio of 2:1, an electric current was flowed at a current density of 10 $mA/cm^2$ for 12 minutes to anodize the silicon wafers. Thus, a plurality of wafers having porous silicon layers of 12 $\mu$m thick formed thereon were prepared in the same manner as in Example 1.

3) Subsequently, the wafers having porous silicon layers formed thereon were subjected to oxidation treatment for 1 hour in a 400° C. atmosphere of oxygen. Since only an oxide film of 5 nm thick or smaller is formed by this oxidation treatment, silicon oxide films are formed only on the surface and pore sidewalls of the porous silicon layer, and regions of single-crystal silicon are left inside the pore sidewalls.

4) To hydrofluoric acid prepared by diluting HF with water to a concentration of 1.25% by weight, the wafers were exposed for about 30 seconds, and then immersed in pure water for 10 minutes to carry out overflow rinsing to remove the very thin silicon oxide films formed on the porous layer surfaces.

5) A CVD epitaxial growth system was used which has a load lock chamber where the wafers are to be placed in the state they are put in a wafer carrier, a transport chamber having a wafer transporting robot set therein, and a processing chamber, connected in sequence. The wafers were held in the carrier and placed in the load lock chamber. The load lock chamber standing at the atmospheric pressure was evacuated to 1 Torr or below by means of a dry pump. Thereafter $N_2$ was flowed therein and the internal pressure was set to 80 Torr. The transport chamber was previously kept at 80 Torr by flowing $N_2$. In the processing chamber, a susceptor comprising a carbon substrate covered with a CVD-SiC film was placed in order to hold the wafer. The susceptor was previously heated with an IR lamp to about 750° C. Into the processing chamber, hydrogen gas purified by means of a hydrogen purifier making use of a heated palladium alloy was previously fed through an inner-wall-polished stainless steel pipe of about 10 m long.

The wafers were transported from the load lock chamber into the processing chamber through the transport chamber by means of the transport robot and were placed on the susceptor.

6) The wafers placed on the susceptor were heated with the IR lamp to raise their temperature at a rate of 100° C. per minute and were kept at 950° C. for 2 seconds as the prebaking. As the preinjection, $SiH_2Cl_2$ was added to hydrogen carrier gas so as to be in a concentration of 28 ppm for 200 seconds. The addition of $SiH_2Cl_2$ was thus completed. Thereafter, in the $H_2$ carrier gas, the temperature was raised to 1,100° C. to interbake for 30 seconds. Then, the temperature was dropped to 900° C., and this time $SiH_2Cl_2$ was added so as to be in a concentration of 0.5 mole %, where the non-porous single-crystal silicon layer was formed in a thickness of 0.32 $\mu$m. Thereafter, the temperature of 900° C. was dropped to 750° C. in an atmosphere of hydrogen, and the wafers were taken out through the transport chamber into the load lock chamber again by means of the transport robot. The non-porous single-crystal silicon layers thus formed were in a thickness of 0.32 $\mu$m on the average, having a difference of 8 nm between its maximum value and minimum value.

7) The wafers on which the non-porous single-crystal silicon was epitaxially grown were placed in a vertical furnace, and the surface of the non-porous single-crystal silicon was oxidized by heat treatment at 1,000° C. in a mixed gas of water vapor formed by burning oxygen and hydrogen and residual oxygen. Thus silicon oxide film of 208 nm thick was formed.

8) The above wafers and second silicon wafers were cleaned well on a cleaning line used in silicon semiconductor device processing, and thereafter the wafers were each gently superposed so that their first principal surfaces faced each other and, and then pressed at their middle, whereupon the wafers were joined.

9) Subsequently, sets of the wafers thus joined were placed in a vertical furnace to heat treat at 1,100° C. for 1 hour in an atmosphere of oxygen.

10) The back of each wafer having the porous silicon layer formed thereon was ground with a grinder to uncover the porous silicon layer over the whole surface.

11) The porous silicon layer thus uncovered was immersed in a solution of a mixture of hydrofluoric acid and hydrogen peroxide water, whereupon the porous silicon layer was all removed in 2 hours and interference color ascribable to the non-porous single-crystal silicon layer and the thermal silicon oxide film was seen over the whole wafer surface. 12) The silicon wafers on which the treatment of step 11) had been completed were cleaned on a cleaning line commonly used in silicon semiconductor device processing, and thereafter the wafers cleaned were placed in a vertical hydrogen annealing furnace to heat treat at 1,100° C. for 4 hours in an atmosphere of 100% hydrogen. The hydrogen gas was previously purified by means of a commercially available hydrogen purifier making use of a palladium alloy, connected with the furnace through an inner-wall-polished stainless steel pipe of about 7 m in total length.

13) Thus, wafers of SOI structure were produced wherein a 200 nm thick silicon oxide layer and a 200 nm thick single-crystal silicon layer were superposed on the second silicon wafer.

The single-crystal silicon layers thus formed were in a thickness of 201 nm on the average, having a difference of 8 nm between its maximum value and minimum value.

These wafers of SOI structure were subjected to defect-actualizing etching to remove the single-crystal silicon layer by 130 nm, and thereafter immersed for 3 minutes in hydrofluoric acid with an HF concentration of 49% by weight. As a result, the buried oxide film was etched with the hydrofluoric acid from the part of crystal defects remaining in the single-crystal silicon etched by the defect-actualizing etching. Thus, the stacking fault density were measured with a Nomarski differential interference contrast microscope. The stacking faults observed were in a density of 64 cm$^{-2}$.

As a result of the above hydrogen annealing, the stacking faults included in the non-porous single-crystal silicon layer were lessened.

On these wafers of SOI structure, the haze was also measured with a foreign matter detector. The haze was found to be 0.18 ppm. On the other hand, the haze was 0.8 ppm in an instance where prebaking was not carried out in the treatment of step 6).

The surfaces of the single-crystal silicon layers formed on the surfaces of these SOI wafers were immersed in hydrofluoric acid, thereafter washed with water and then etched with an alkali solution to remove them. Thereafter, the silicon oxide films thus uncovered were removed with hydrofluoric acid. Each bonding interface thus uncovered was observed with an atomic force microscope. As a result of observation in a 20 μm square region, a good plane was seen, and its surface roughness (Rrms) was 0.3 nm. Also, no concavities of 10 nm or larger in depth were seen.

On the other hand, in an instance where the prebaking at 1,100° C. was not carried out in the treatment of step 6), concavities of 100 nm in size and about 10 to 20 nm in depth were seen at intervals of about one concavity in an about 1 μm square region.

14) Thin-film SOI layers were obtained, having a stacking fault density of lower than 100 cm$^{-2}$ and also having a uniform layer thickness and a smooth bonding interface.

EXAMPLE 3

900° C., 450 Torr Prebaking (2 or 120 sec.) and Preinjection/1,050° C. Interbaking (30 sec.)/2 μm Epitaxy:

1) The same silicon wafers as those in Example 1 were prepared.

2) On each wafer surface, the porous silicon layer of 12 μm thick was formed in the same manner as in Example 1.

3) Subsequently, the wafers having porous silicon layers formed thereon were subjected to oxidation treatment for 1 hour in a 400° C. atmosphere of oxygen.

4) The very thin silicon oxide films formed on the porous layer surfaces were removed in the same manner as in Example 1.

5) The wafers on which the treatment of step 4) had been completed were transported into the processing chamber of the same epitaxial growth system as that used in Example 1.

6) After the pressure inside the processing chamber was set to 450 Torr, the wafers placed on the susceptor were heated with the IR lamp to raise their temperature at a rate of 100° C. per minute and were kept at 900° C. for 2 seconds as the prebaking. Next, SiH$_4$ was added to hydrogen carrier gas so as to be in a concentration of 28 ppm to accomplish the preinjection treatment for 200 seconds. After the addition of SiH$_4$ was completed, the temperature was raised to 1,050° C. to interbake for 30 seconds. Then, the pressure was lowered to 80 Torr and the temperature was dropped to 900° C., and this time SiH$_2$Cl$_2$ was added so as to be in a concentration of 0.7 mole %, where the non-porous single-crystal silicon layer was formed in a thickness of 2 μm. Then the temperature was dropped to 750° C. in an atmosphere of hydrogen, and the wafers were taken out through the transport chamber into the load lock chamber again by means of the transport robot.

On another wafer, the prebaking in the 900° C. hydrogen atmosphere was carried out for a time of 120 seconds. Except for this, the wafer was subjected to the same treatment and then returned to the load lock chamber.

7) The surface roughness of the wafers on which the treatment of step 6) had been completed was measured with an atomic force microscope to find that the surface roughness (Rrms) in the region of 20 μm square was 0.22 nm in all wafers, which was as good as that of commercially available silicon wafers. On the other hand, in an instance where the interbaking at 1,050° C. for 30 seconds was not applied, the surface roughness was 0.37 nm.

8) The wafers on which the treatment of step 7) had been completed were subjected to defect-actualizing etching. The crystal defects included in the non-porous single-crystal silicon layer were thus actualized and thereafter observed with a Nomarski differential interference contrast microscope. The defects observed were occupied by stacking faults by 99% or more. The stacking faults were in a density of 350 cm$^{-2}$ in case of prebaking for 2 seconds, and 400

$cm^{-2}$ in the case of prebaking for 60 seconds. Thus, it was dramatically lowered to less than 1,000 $cm^{-2}$ compared with a density of $1.5 \times 10^4/cm^2$ which was in the case of prebaking at 1,100° C. for 120 seconds.

EXAMPLE 4

870° C., 80 Torr Prebaking (5 or 60 sec.) and Preinjection/ 1,000° C., 80 Torr Interbaking (30 sec.)/2 μm Epitaxy:

1) The same silicon wafers as those in Example 1 were prepared.

2) On each wafer surface, the porous silicon layer of 12 μm thick was formed in the same manner as in Example 1.

3) Subsequently, the wafers having porous silicon layers formed thereon were subjected to oxidation treatment for 1 hour in a 400° C. atmosphere of oxygen.

4) The very thin silicon oxide films formed on the porous layer surfaces were removed in the same manner as in Example 1.

5) The wafers on which the treatment of step 4) had been completed were transported into the processing chamber of the same epitaxial growth system as that used in Example 1.

6) After the pressure inside the processing chamber was set to 80 Torr, the wafers placed on the susceptor were heated with the IR lamp to raise their temperature at a rate of 100° C. per minute, and were kept at 860° C. for 5 seconds as the prebaking. Next, $SiH_4$ was added to hydrogen carrier gas so as to be in a concentration of 35 ppm to accomplish the preinjection treatment for 150 seconds. After the addition of $SiH_4$ was completed, the temperature was raised to 1,000° C. to interbake for 20 seconds. Then, $SiH_2Cl_2$ was added so as to be in a concentration of 1 mole %, where the non-porous single-crystal silicon layer was formed in a thickness of 2 μm. Then the temperature was dropped to 750° C. in an atmosphere of hydrogen, and the wafers were taken out through the transport chamber into the load lock chamber again by means of the transport robot.

On another wafer, the prebaking was carried out for a time of 60 seconds. Except for this, the wafer was subjected to the same treatment and then returned to the load lock chamber.

7) The surface roughness of the wafers on which the above treatment had been completed was measured with an atomic force microscope to find that the surface roughness (Rrms) in the region of 20 μm square was 0.2 nm in all wafers, which was as good as that of commercially available silicon wafers. On the other hand, in an instance where no interbaking was applied, the surface roughness was 0.35 nm.

8) The wafers on which the treatment of step 7) had been completed were subjected to defect-actualizing etching. The crystal defects included in the non-porous single-crystal silicon layer were thus actualized and thereafter observed with a Nomarski differential interference contrast microscope. The defects observed were occupied by stacking faults by 99% or more. The stacking faults were in a density of 120 $cm^{-2}$ in the case of prebaking for 2 seconds, and 430 $cm^{-2}$ in the case of prebaking for 30 seconds. Thus, it was dramatically lowered to less than 1,000 $cm^{-2}$ compared with a density of $1.5 \times 10^4/cm^2$ which was in the case of prebaking at 1,100° C. for 120 seconds.

EXAMPLE 5

950° C. Prebaking (2 sec.) and Preinjection/1,100° C. Interbaking (40 sec.)/0.32 μm Epitaxy/Bond Separation:

1) The same silicon wafers as those used in Example 2 were prepared.

2) The above silicon wafers were anodized in a hydrofluoric acid solution.

First anodizing was carried out under the following conditions.
Current density: 7 $mA/cm^{-2}$
Anodizing solution: $HF:H_2O:C_2H_5OH=1:1:1$
Time: 5 minutes
Thickness of porous silicon layer: 5 μm Thereafter, second anodizing was carried out under the following conditions.
Current density: 50 $mA/cm^{-2}$
Anodizing solution: $HF:H_2O:C_2H_5OH=1:1:1$
Time: 10 seconds
Thickness of porous silicon layer: –0.2 μm The low-porosity porous layer thus formed on each wafer surface was in a thickness of 5 μm.

As a result of this anodizing, the porous silicon layer formed under the second conditions had a higher porosity. Thus a structurally brittle high-porosity thin layer was formed beneath the low-porosity porous layer.

3) Subsequently, the wafers having porous silicon layers formed thereon were subjected to oxidation treatment for 1 hour in a 400° C. atmosphere of oxygen.

4) To hydrofluoric acid prepared by diluting HF with water to a concentration of 1.25% by weight, the wafers were exposed for about 30 seconds, and then immersed in pure water for 10 minutes to carry out overflow rinsing to remove the very thin silicon oxide films formed on the porous layer surfaces.

5) The wafers placed on the susceptor were heated with the IR lamp to raise their temperature at a rate of 100° C. per minute and were kept at 950° C. for 2 seconds as the prebaking. Next, $SiH_4$ was added to hydrogen carrier gas so as to be in a concentration of 28 ppm to accomplish the preinjection treatment for 200 seconds. After the addition of $SiH_4$ was completed, the temperature was raised to 1,050° C. to interbake for 40 seconds. Then, the temperature was dropped to 900° C., and this time $SiH_2Cl_2$ was added to $H_2$ carrier gas so as to be in a concentration of 0.5 mole %, where the non-porous single-crystal silicon layer was formed in a thickness of 0.32 μm. Then the temperature was dropped to 750° C. in an atmosphere of hydrogen, and the wafers were taken out through the transport chamber into the load lock chamber again by means of the transport robot. The non-porous single-crystal silicon layers thus formed were in a thickness of 0.32 μm on the average, having a difference of 8 nm between its maximum value and minimum value.

6) The wafers on which the non-porous single-crystal silicon was epitaxially grown were placed in a vertical furnace, and the surface of the non-porous single-crystal silicon was oxidized by heat treatment at 1,000° C. in a mixed gas of water vapor formed by burning oxygen and hydrogen and residual oxygen. Thus silicon oxide film of 208 nm thick was formed.

7) The above wafers having passed step 6) and wafers additionally prepared (second silicon wafers) were cleaned well on a cleaning line used in silicon semiconductor device processing, and thereafter the wafers were each gently superposed so that their principal surfaces faced each other, and then pressed at their middle, whereupon the wafers were joined.

8) Subsequently, sets of the wafers thus joined were placed in a vertical furnace to heat treat at 1,100° C. for 1 hour in an atmosphere of oxygen.

9) A water jet was blown against the sidewalls of each set of the wafers bonded, whereupon the high-porosity layer was cracked and the wafers were separated into two parts.

Besides this method, the wafers may be separated by a method in which external pressure is applied by pressure, tension, shear or using wedges, a method in which ultrasonic waves are applied, a method in which heat is applied, a method in which the porous silicon is expanded by oxidation to apply inner pressure to the interior of the porous silicon, or a method in which the porous silicon is pulsewise heated to apply thermal stress thereto or to soften it. The wafers can be separated by any of these methods.

10) The second wafer having on its surface the porous silicon layer thus uncovered was immersed in a solution of a mixture of hydrofluoric acid and hydrogen peroxide water, whereupon the porous silicon layer was all removed in about 2 hours and interference color ascribable to the non-porous single-crystal silicon layer and the thermal silicon oxide film was seen over the whole wafer surface.

11) The silicon wafers on which the treatment of step 10) had been completed were cleaned on a cleaning line commonly used in silicon semiconductor device processing, and thereafter the cleaned wafers were placed in a vertical hydrogen annealing furnace to heat treat at 1,100° C. for 4 hours in an atmosphere of 100% hydrogen. The hydrogen gas was previously purified by means of a commercially available hydrogen purifier making use of a palladium alloy, connected with the furnace through an inner-wall-polished stainless steel pipe of about 7 m long.

12) Thus, SOI wafers were obtained, having a structure wherein a 200 nm thick silicon oxide layer and a 200 nm thick single-crystal silicon layer were superposed on the second silicon wafer.

The single-crystal silicon layers thus formed were in a thickness of 201 nm on the average, having a difference of 8 nm between its maximum value and minimum value.

13) These wafers were subjected to defect-actualizing etching to remove the single-crystal silicon layer by 130 nm, and thereafter immersed for 3 minutes in hydrofluoric acid with an HF concentration of 49% by weight. The stacking faults observed with a Nomarski differential interference contrast microscope were in a density of 64 cm$^{-2}$. As a result of the hydrogen annealing, the stacking faults included in the non-porous single-crystal silicon layer were lessened.

14) On these wafers, the haze was measured with a foreign matter detector and was found to be 0.18 ppm. On the other hand, the haze was 0.8 ppm in an instance where the prebaking was not carried out in the treatment of step 5).

The surfaces of the single-crystal silicon layers formed on the surfaces of these SOI wafers were immersed in hydrofluoric acid, thereafter washed with water and then etched with an alkali solution to remove them. Thereafter, the silicon oxide films thus uncovered were removed with hydrofluoric acid. Each bonding interface thus uncovered was observed with an atomic force microscope. As a result of observation in a 20 μm square region, a good plane was seen, and its surface roughness (Rrms) was 0.32 nm. Also, no concavities of 10 nm or larger in depth were seen. On the other hand, in an instance where the prebaking was not carried out in the treatment of step 5), concavities of 100 nm in size and about 10 to 20 nm in depth were seen at intervals of about one concavity in an about 1 μm square region.

Thus, thin-film SOI layers were obtained, having a stacking fault density of lower than 100 cm$^{-2}$ and also having a uniform thickness and a smooth bonding interface.

EXAMPLE 6

950° C., 80 Torr Prebaking (2 sec.) and Preinjection/1,100° C. Interbaking (30 sec.)/Heteroepitaxy:

1) Four sheets of six-inch diameter (100) p$^+$-type single-crystal silicon substrates having a thickness of 615 μm and a resistivity of 0.01 Ω·cm were anodized in a solution of hydrofluoric acid diluted with alcohol. Thus, porous silicon layers were formed on their mirror-surface principal surface.

The anodizing was carried out under the following conditions.
Current density: 7 mA/cm$^2$
Anodizing solution: HF:H$_2$O:C$_2$H$_5$OH=1:1:1
Time: 12 minutes
Thickness of porous silicon layer: 10 μm
Porosity: 20%

2) Subsequently, the wafers having porous silicon layers formed thereon were subjected to oxidation treatment for 1 hour in a 400° C. atmosphere of oxygen.

3) To hydrofluoric acid with an HF concentration of 1.25% by weight, the wafers were exposed for about 30 seconds, and then immersed in pure water for 10 minutes to carry out overflow rinsing to remove the very thin silicon oxide films formed on the porous layer surfaces.

4) The wafers placed on the susceptor of the same system as that used in Example 1 were heated with the IR lamp to raise their temperature at a rate of 100° C. per minute and were kept at 950° C. for 2 seconds as the prebaking. Next, SiH$_4$ was added to hydrogen carrier gas so as to be in a concentration of 28 ppm to accomplish the preinjection treatment for 200 seconds. After the addition of SiH$_4$ was completed, the interbaking was carried out at 1,100° C. for 30 seconds. Thereafter, the temperature was dropped to 750° C. in an atmosphere of hydrogen, and the wafers were taken out through the transport chamber into the load lock chamber again by means of the transport robot. The surface layers thus made porous were in a thickness of 0.32 μm on the average.

On each porous silicon layer thus formed, single-crystal GaAs was epitaxially grown by MOCVD in a thickness of 1 μm. Growth conditions were as follows:
Source gases: TMG (trimethylgallium)/AsH$_3$/H$_2$
Gas pressure: 80 Torr
Temperature: 700° C.

As a result of cross-sectional observation with a transmission electron microscope, it was confirmed that no stacking faults were included in the GaAs layers and that GaAs layers having a good crystallizability were formed. Simultaneously, it was also confirmed that a very sharp interface was formed between the GaAs layer and the porous silicon layer whose surface was sealed up with silicon.

Stacking faults actualized by defect-actualizing etching were counted on an optical microscope to determine the stacking fault density. As a result, it was about 1×10$^4$/cm$^2$.

EXAMPLE 7

A substrate having a porous silicon layer was subjected to prebaking and preinjection at 950° C., and then to intermediate heat treatment (interbaking) at 1,100° C. for 30 seconds. Subsequently, a single-crystal silicon layer of 0.32 μm thick was formed thereon by epitaxial growth at 900° C. Thereafter, the SOI structure was formed by the bonding like that in Example 2, and then the SOI layer obtained was etched with an alkali solution to remove it. The buried insulating material layer, the silicon oxide layer was removed with hydrofluoric acid to make observation with an atomic force microscope. Since in this SOI structure the epitaxial silicon layer formed on the porous silicon is thermally oxidized and is bonded to the other silicon wafer, the bonding interface is the interface between the silicon substrate of SOI structure and the buried silicon oxide layer, and hence this interface was uncovered to make the observation.

In the sample obtained in the present Example, no concavities of about 100 nm in size and about 17 nm in depth were seen at all; these were seen in a sample not subjected to the intermediate heat treatment at 1,100° C. for 30 seconds.

When such concavities are present, the haze is in a value of, e.g., 1 ppm when the SOI structure is observed with a commercially available foreign matter detector. When, however, such concavities are not seen, only a haze on the order of 0.1 ppm corresponding to that of single-crystal silicon wafers is seen. Thus, in the case of a low haze, even very small foreign matter of 0.2 µm or smaller can be detected with the foreign matter detector without being obscured by the scattering due to haze. Also, in the present example, there is no possibility at all that, when devices are produced, the bond strength at the interface is insufficient to cause separation during the process.

As described above, the intermediate heat treatment can bring about an improvement in surface smoothness of the non-porous single-crystal layer and surface smoothness of the porous silicon layer whose surface pores have been sealed up.

In addition, the baking carried out under such conditions that the silicon etching depth is controlled to be 2 nm or less, and more preferably 1 nm or less, can easily reduce the stacking faults of the non-porous single-crystal layer to a density of less than $1,000/cm^{-2}$ of course, and further to even a density of less than $100/cm^{-2}$. Thus, the application of the present invention to the process for producing SOI substrates by bonding makes it possible to obtain SOI layers having a uniform thickness, having many fewer stacking faults and also having a smooth bonding interface.

Non-porous single-crystal layers can be obtained which have smoother surfaces than the case where non-porous single-crystal silicon layers are formed without performing the intermediate heat treatment. Also, the surfaces can be made smooth more efficiently than the case where the surface is made smooth by making heat treatment after the formation of the non-porous single-crystal layer is completed and without making the intermediate heat treatment.

What is claimed is:

1. A process for producing a semiconductor substrate having a non-porous single-crystal layer on a surface of a porous silicon layer comprising, in the listed order, the steps of:

sealing surface pores of the porous silicon layer to lower its surface pore density;

heat treating the porous silicon layer at a temperature higher than the temperature in the sealing step; and epitaxially growing the non-porous single-crystal layer on the surface of the porous silicon layer.

2. The process according to claim 1, wherein the sealing step comprises at least one step selected from baking in an atmosphere of ultrahigh vacuum and baking in a reducing atmosphere containing hydrogen, and the step of imparting silicon atoms to the surface of the porous silicon layer after the baking step.

3. The process according to claim 2, wherein in the baking step the porous silicon is etched to a death of 2 nm or less.

4. The process according to claim 1, wherein the heat treating step is carried out in an atmosphere containing no silicon source gas.

5. The process according to claim 1, wherein the heat treating step is carried out at a temperature of 1,000° C. or above.

6. The process according to claim 3, wherein the porous silicon is etched to a depth of 1 nm or less.

7. The process according to claim 1, wherein the sealing step is carried out after a preoxidation step wherein pore wall surfaces of the porous silicon layer are oxidized.

8. The process according to claim 7, which further comprises the step of removing an oxide film formed on the surface of the porous silicon layer by the preoxidation step.

9. The process according to claim 1, wherein the sealing step, the heat treating step and the growth step are carried out in a reaction chamber connected to a load lock chamber.

10. The process according to claim 1, wherein the sealing step is carried out at a pressure higher than that in the growth step.

11. The process according to claim 1, wherein the non-porous single-crystal layer is a layer formed by heteroepitaxial growth.

12. The process according to claim 1, wherein the porous silicon layer is formed by anodizing a single-crystal silicon.

13. The process according to claim 12, wherein the single-crystal silicon is anodized in a solution containing hydrofluoric acid, water and an alcohol.

14. The process according to claim 12, wherein the single-crystal silicon to be anodized is doped with an impurity to the level of degeneracy.

15. The process according to claim 1, wherein the heat treating step is carried out in a reducing atmosphere containing hydrogen.

16. The process according to claim 1, wherein the heat treatment is made after the surface of the non-porous single-crystal layer begins to decrease in haze during the sealing step.

17. The process according to claim 1, wherein the heat treatment is made after the surface of the non-porous single-crystal layer begins to decrease in roughness during the sealing step.

18. The process according to claim 1, wherein the sealing step is carried out at a temperature below 1,000° C.

19. The process according to claim 1, wherein the growth step is carried out at a temperature lower than the temperature in the heat treating step.

20. The process according to claim 1, wherein conditions are so set that a thickness of a non-porous portion formed on the porous silicon layer in the sealing step does not become larger than 50 nm.

21. The process according to claim 2, wherein the step of imparting silicon atoms is begun before all the surface pores of the porous silicon layer are sealed in the baking step.

22. The process according to claim 1, wherein the heat treating step is begun once the porous silicon layer has a surface pore density of $1 \times 10^8$ $cm^{-2}$ or less as a result of the sealing step.

23. The process according to claim 1, wherein the sealing step and the heat treating step are carried out under the same pressure and the growth step is carried out under a pressure different from that pressure.

24. The process according to claim 1, wherein the growth step is carried out at a temperature lower than the temperature in the sealing step.

25. A process for producing a semiconductor substrate comprising, in the listed order, the steps of:

providing a first substrate having a porous silicon layer on a non-porous silicon substrate;

sealing surface pores of the porous silicon layer to lower its surface pore density;

heat treating the porous silicon layer whose surface pores have been sealed at a temperature higher than the temperature in the sealing step;

epitaxially growing a non-porous single-crystal layer on the surface of the porous silicon layer;

bonding the non-porous single-crystal layer to a second substrate; and removing the porous silicon layer so as to leave the non-porous single-crystal layer on the second substrate.

26. The process according to claim 25, wherein the sealing step comprises at least one step selected from baking in an atmosphere of ultrahigh vacuum and baking in a reducing atmosphere containing hydrogen, and the step of imparting silicon atoms to the surface of the porous silicon layer after the baking step.

27. The process according to claim 25, wherein the sealing step is carried out after a preoxidation step wherein pore wall surfaces of the porous silicon layer are oxidized.

28. The process according to claim 27, which further comprises the step of removing an oxide film formed on the surface of the porous silicon layer by the preoxidation step.

29. The process according to claim 25, wherein the bonding step comprises the step of bonding an oxide film formed on the non-porous single-crystal layer to the second substrate.

30. The process according to claim 25, wherein the bonding step comprises the step of bonding a first insulating film formed on the non-porous single-crystal layer to a second insulating film formed on the second substrate.

31. The process according to claim 25 which further comprises, before the step of removing the porous silicon layer, the step of removing the non-porous silicon substrate.

32. The process according to claim 25, wherein the step of removing the porous silicon layer comprises the step of separating a multi-layer structure formed in the bonding step at the porous silicon layer.

* * * * *

UNITED STATES PATENT AND TRADEMARK OFFICE
CERTIFICATE OF CORRECTION

PATENT NO. : 6,143,629
DATED : November 7, 2000
INVENTOR(S) : Nobuhiko Sato

It is certified that error appears in the above-identified patent and that said Letters Patent is hereby corrected as shown below:

Title page,
Item [56], Other Publications, insert:

N. Sato, et al., "Epitaxial Growth on Porous Si for a New Bond and Etch-Back SOI", Proc. 7$^{th}$ Int'l Symp. on Si Mater. Sci and Tech., Electrochem. Soc., Inc., pp. 443-453 (1994).

N. Sato, et al., "Advanced Quality in Epitaxial Layer Transfer by Bond and Etch-Back of Porous Si", Jpn. J. Appl. Phys, vol. 35, pp. 973-977 (1996).

C. Oules, et al. "Epitaxal Silicon Growth on Porous Silicon by Reduced Pressure, Low Temperature Chemical Vapour Deposition", Mater. Sci. Eng., pp. 435-439 (1989).

C. Oules, et al., "Silicon on Insulator Structures Obtained by Epitaxial Growth of Silicon over Porous Silicon", J. Electrochem. Soc., vol. 139, no. 12, pp. 3595-3599 (1992).

Abstract,
Item [57], "wafers this" should read -- wafers. This --.

Column 1,
Line 11, "of" should be deleted;
Line 30, "areas" should read -- area --.

Column 4,
Line 10, "d" should be deleted.

Column 7,
Line 18, "be." should read -- be difficult to obtain. --

Column 9,
Line 35, "S. Dyer," should read -- S. Iyer, --.

Column 10,
Line 51, "denotes." should read -- denotes --.

Column 13,
Line 15, "21. Reference" should read -- 21. ¶ Reference --.

UNITED STATES PATENT AND TRADEMARK OFFICE
CERTIFICATE OF CORRECTION

PATENT NO. : 6,143,629
DATED : November 7, 2000
INVENTOR(S) : Nobuhiko Sato

It is certified that error appears in the above-identified patent and that said Letters Patent is hereby corrected as shown below:

Column 14,
Line 1, "water washing" should read -- water-washing --;
Line 36, "used" should read -- used; --.

Column 15,
Line 35, "into" should read -- in --.

Column 16,
Line 4, "m can not" should read -- cannot --;
Line 37, "having remained" should be deleted.

Column 17,
Line 10, "brought down" should read -- reduced --;
Line 10, "$10^6/cm^2$," should read -- $10^2/cm^2$, --.

Column 19,
Line 29, "silicon" should read -- silicon to obtain --.

Column 20,
Line 26, "be" should be deleted;
Line 65, "the" should be deleted.

Column 21,
Line 29, "can not" should read -- cannot --;
Line 53, "changes" should read -- changing --.

Column 25,
Line 4, "Thus" should read -- Thus, --;
Line 24, "surface. 12)" should read -- surface. ¶ 12) --;
Line 44, "nm," should read -- m, --.

Column 27,
Line 28, "gas" should be deleted.

UNITED STATES PATENT AND TRADEMARK OFFICE
CERTIFICATE OF CORRECTION

PATENT NO. : 6,143,629
DATED : November 7, 2000
INVENTOR(S) : Nobuhiko Sato

It is certified that error appears in the above-identified patent and that said Letters Patent is hereby corrected as shown below:

<u>Column 30,</u>
Line 23, "gas" should be deleted.

<u>Column 31,</u>
Line 35, "the" should be deleted (first occurrence).

Signed and Sealed this

Thirteenth Day of November, 2001

Attest:

*Attesting Officer*

NICHOLAS P. GODICI
*Acting Director of the United States Patent and Trademark Office*